United States Patent
Kodama et al.

(10) Patent No.: US 8,894,187 B2
(45) Date of Patent: *Nov. 25, 2014

(54) LIQUID APPLICATION DEVICE, LIQUID APPLICATION METHOD, AND NANOIMPRINT SYSTEM

(71) Applicant: FUJIFILM Corporation, Tokyo (JP)

(72) Inventors: Kenichi Kodama, Kanagawa (JP);
Tadashi Omatsu, Kanagawa (JP);
Satoshi Wakamatsu, Kanagawa (JP);
Kunihiko Kodama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/730,578

(22) Filed: Dec. 28, 2012

(65) Prior Publication Data

US 2013/0113863 A1    May 9, 2013

(30) Foreign Application Priority Data

Jun. 30, 2010    (JP) .................. 2010-150365

(51) Int. Cl.
*B41J 2/045* (2006.01)
*G03F 7/00* (2006.01)
*B41J 2/14* (2006.01)
*B82Y 40/00* (2011.01)
*B82Y 10/00* (2011.01)

(52) U.S. Cl.
CPC ........... *B41J 2/14209* (2013.01); *G03F 7/0002* (2013.01); *B82Y 40/00* (2013.01); *B82Y 10/00* (2013.01)
USPC .................. 347/68; 347/65; 347/41; 347/71; 347/70

(58) Field of Classification Search
USPC .......................................... 347/68–72, 65, 41
See application file for complete search history.

(56) References Cited

U.S. PATENT DOCUMENTS

| 5,338,879 A | 8/1994 | Fujiwa et al. |
| 5,378,736 A | 1/1995 | Fujiwa et al. |

(Continued)

FOREIGN PATENT DOCUMENTS

| JP | 04-036263 A | 2/1992 |
| JP | 04-069360 A | 3/1992 |

(Continued)

OTHER PUBLICATIONS

International Search Report; PCT/JP2011/065242; Oct. 18, 2011.

(Continued)

*Primary Examiner* — Henok Legesse
(74) *Attorney, Agent, or Firm* — Studebaker & Brackett PC

(57) ABSTRACT

A liquid application device includes: a liquid discharge head having a structure in which nozzles for performing droplet ejection of a functional liquid onto a substrate are aligned in a row in a predetermined direction, and including liquid chambers connected to the nozzles respectively and piezoelectric elements which are provided correspondingly to the liquid chambers and serve to pressurize the liquid in the liquid chambers; a relative movement unit for causing relative movement between the substrate and the liquid discharge head; and a droplet ejection control unit for operating the piezoelectric elements so as to cause the liquid to land discretely on the substrate, and controlling operation of the piezoelectric elements according to each of groups formed by grouping the nozzles correspondingly to the structure of the liquid discharge head.

16 Claims, 24 Drawing Sheets

(56) References Cited

U.S. PATENT DOCUMENTS

| | | | |
|---|---|---|---|
| 6,517,175 B2 | 2/2003 | Kanaya et al. | |
| 7,931,348 B2 | 4/2011 | Kida | |
| 8,038,891 B2 | 10/2011 | Yokouchi | |
| 2004/0119779 A1 | 6/2004 | Elgee | |
| 2005/0057587 A1 | 3/2005 | Cheng et al. | |
| 2009/0267268 A1* | 10/2009 | Yoneda et al. | 264/319 |
| 2009/0284570 A1 | 11/2009 | Jung et al. | |
| 2009/0317555 A1 | 12/2009 | Hori | |
| 2010/0099322 A1* | 4/2010 | Katagami et al. | 445/24 |
| 2012/0147075 A1 | 6/2012 | Hiyoshi et al. | |
| 2013/0010020 A1 | 1/2013 | Kodama | |

FOREIGN PATENT DOCUMENTS

| | | |
|---|---|---|
| JP | H06-218951 A | 8/1994 |
| JP | 11-100378 A | 4/1999 |
| JP | 2006-047235 A | 2/2006 |
| JP | 2007-117833 A | 5/2007 |
| JP | 2007-125748 A | 5/2007 |
| JP | 2008-105414 A | 5/2008 |
| JP | 2008-209701 A | 9/2008 |
| JP | 2008-213421 A | 9/2008 |
| JP | 2009-083434 A | 4/2009 |
| JP | 2009-088376 A | 4/2009 |
| JP | 2009-090208 A | 4/2009 |
| JP | 2009-103823 A | 5/2009 |
| JP | 2009-190306 A | 8/2009 |
| JP | 2009-202044 A | 9/2009 |
| JP | 2009-218550 A | 9/2009 |
| JP | 2010-005502 A | 1/2010 |
| JP | 2010-101933 A | 5/2010 |
| WO | 2005/120834 A2 | 12/2005 |

OTHER PUBLICATIONS

Written Opinion of the International Searching Authority; PCT/JP2011/065242; Oct. 18, 2011.
International Search report; PCT/JP2011/064626; Aug. 2, 2011.
An Office Action "notification of Reasons for Rejection" by the Japanese Patent Office on Feb. 5, 2013, which corresponds to Japanese Patent Application No. 2010-150366 and is related to U.S. Appl. No. 13/730,476 with a partial translation.
An Office Action; "Notification of Reasons for Rejection," issued by the Japanese Patent Office on Nov. 20, 2013, which corresponds to Japanese Patent Application No. 2010-150365 and is related to U.S. Appl. No. 13/730,578; with a partial translation.
Office Action; U.S. Appl. No. 13/730,476; Sep. 26, 2014.

* cited by examiner

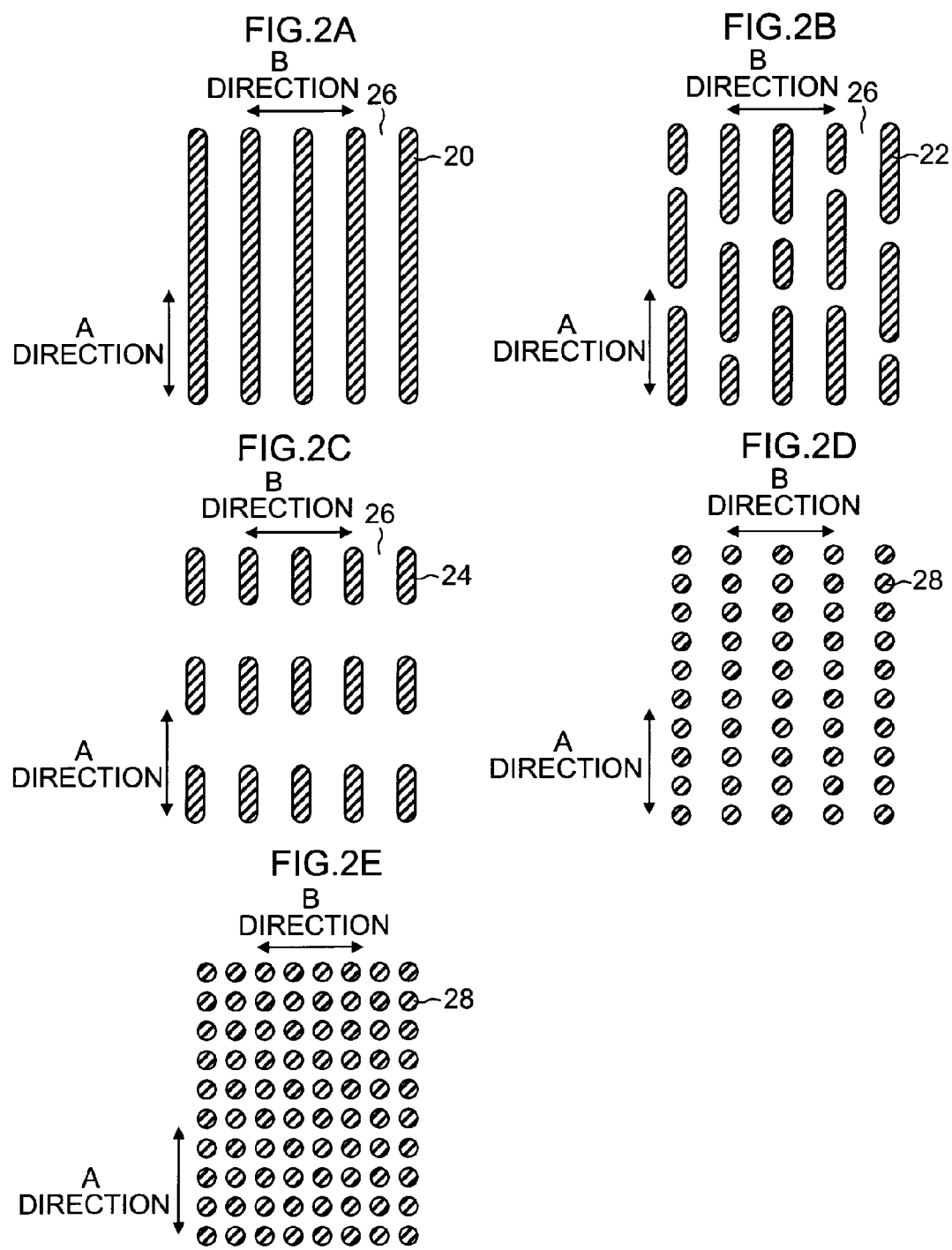

SUBSTRATE CONVEYANCE DIRECTION
y DIRECTION

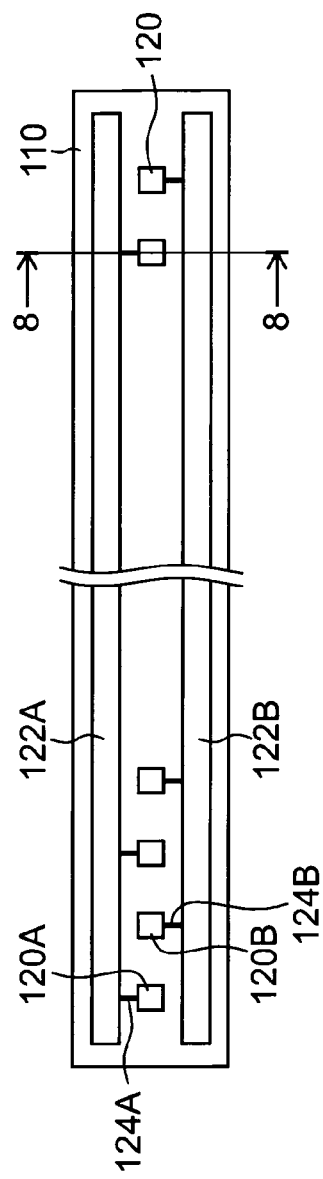

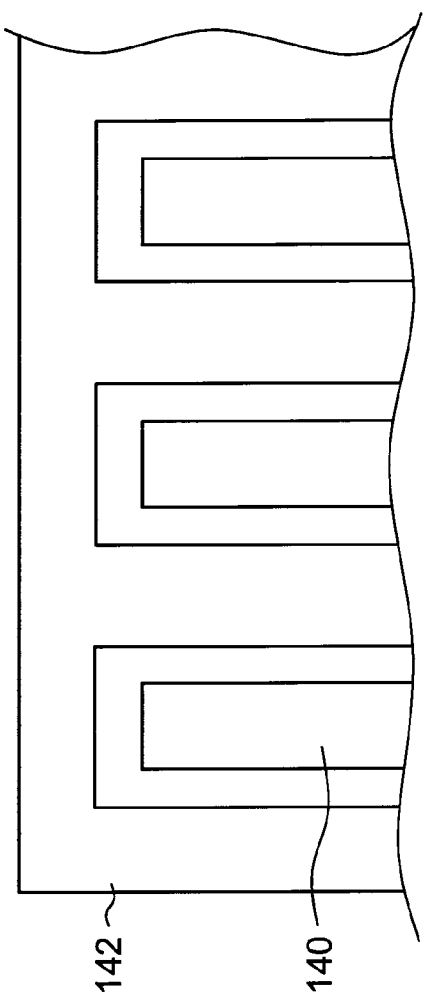

FIG. 23

| CONDITION | CONTACT ANGLE (deg.) | | | DISCHARGE ABILITY | |
|---|---|---|---|---|---|
| | STATIC | FORWARD | REARWARD | FREQUENCY DEPENDENCE | NOZZLE SURFACE |
| 1 | 89 | 83 | 62 | DISCHARGE POSSIBLE AT 10 kHz | Dry |
| 2 | 68 | 70 | 60 | DISCHARGE POSSIBLE AT 10 kHz | Dry |
| 3 | 50 | 52 | 40 | TENDENCY FOR FLIGHT BENDING FROM 5 kHz | Wet |
| 4 | 40 | 41 | 23 | TENDENCY FOR FLIGHT BENDING FROM 10 kHz | Wet |

LIQUID APPLICATION DEVICE, LIQUID APPLICATION METHOD, AND NANOIMPRINT SYSTEM

TECHNICAL FIELD

The present invention relates to a liquid application apparatus, a liquid application method, and a nanoimprint system, and more particularly to a liquid application technique for applying functional liquid to a medium such as a substrate by an inkjet method.

BACKGROUND ART

Nanoimprint lithography (NIL) is known as a technique for forming microstructures on substrates that is adapted to recent miniaturization and increased integration of semiconductor integrated circuits. According to a nanoimprint lithography, a resist (UV-curable resin) applied to a substrate is cured by irradiation with UV radiation while being pressed by a stamp having a desired protrusion-depression pattern to be transferred, and then the stamp is separated (withdrawn) from the resist located on the substrate, thereby transferring the micropattern formed on the stamp to the substrate (resist).

Patent Literatures 1 and 2 (PTLs 1 and 2) disclose systems for applying a liquid of an imprint material to a substrate by using an inkjet method. With the systems disclosed in Patent Literatures 1 and 2, when a constant amount of liquid is dispensed over the substrate, the jetted amount is optimized by changing the ejected droplet density or droplet ejection amount according to the volatilization amount of the pattern or imprint material (resist), throughput is increased, and uniformity of the residual thickness is increased.

SUMMARY OF INVENTION

Technical Problem

However, Patent Literatures 1 and 2 merely disclose an algorithm for determining the preferred jetting arrangement and disclose no specific configuration such as hardware for realizing the ideal ejected droplet density or droplet ejection amount.

Solution to Problem

The present invention has been created with the foregoing in view and it is an object of the present invention to provide a liquid application device, a liquid application method, and a nanoimprint system that make it possible to optimize jetting of functional liquid on a substrate by an inkjet method and form a desired micropattern.

In order to attain an abovementioned object, one aspect of the present invention is directed to a liquid application device comprising: a liquid discharge head having a structure in which nozzles for performing droplet ejection of a functional liquid onto a substrate are aligned in a row in a predetermined direction, and including liquid chambers connected to the nozzles respectively and piezoelectric elements which are provided correspondingly to the liquid chambers and serve to pressurize the liquid in the liquid chambers; a relative movement unit for causing relative movement between the substrate and the liquid discharge head; and a droplet ejection control unit for operating the piezoelectric elements so as to cause the liquid to land discretely on the substrate, and controlling operation of the piezoelectric elements according to each of groups formed by grouping the nozzles correspondingly to the structure of the liquid discharge head.

Another aspect of the present invention is directed to a liquid application method comprising the steps of causing relative movement between a substrate and a liquid discharge head having a structure in which nozzles for performing droplet ejection of a functional liquid onto the substrate are aligned in a row in a predetermined direction and including liquid chambers connected to the nozzles respectively and piezoelectric elements which are provided correspondingly to the liquid chambers and serve to pressurize the liquid in the liquid chambers, and causing the piezoelectric elements to operate with a predetermined droplet ejection period in such a manner that the liquid lands discretely on the substrate, wherein the piezoelectric elements are operated so as to cause the liquid to land discretely on the substrate, the plurality of nozzles are grouped correspondingly to the structure of the liquid discharge head, and operation of the piezoelectric elements is controlled according to each of the groups.

Another aspect of the present invention is directed to a nanoimprint system comprising: a liquid discharge head having a structure in which nozzles for performing droplet ejection of a functional liquid onto a substrate are aligned in a row in a predetermined direction, and including liquid chambers connected to the nozzles respectively and piezoelectric elements which are provided correspondingly to the liquid chambers and serve to pressurize the liquid in the liquid chambers; a relative movement unit for causing relative movement between the substrate and the liquid discharge head; a droplet ejection control unit for operating the piezoelectric elements so as to cause the liquid to land discretely on the substrate, and controlling operation of the piezoelectric elements according to each of groups formed by grouping the nozzles correspondingly to the structure of the liquid discharge head; and a transfer unit for transferring a protrusion-depression pattern formed on a mold.

Advantageous Effects of Invention

According to the present invention, nozzles and the piezoelectric elements corresponding to the nozzles are grouped and jetting control is performed for each group. Therefore, the occurrence of ejected droplet density variations caused by variation among the nozzles or piezoelectric elements can be inhibited.

BRIEF DESCRIPTION OF DRAWINGS

FIGS. 2A-2E illustrate protrusion-depression patterns of a silicon mold.

FIG. 7 is a plan view of a head for use in the imprint system shown in FIG. 1.

FIG. 11 illustrates an electrode pattern of the piezoelectric elements used in the head shown in FIG. 7.

FIG. 23 shows results obtained in an evaluation test of a liquid-repelling film formed on the nozzle surface.

DESCRIPTION OF EMBODIMENTS

<Explanation of Nanoimprint Method>

First, the nanoimprint method according to an embodiment of the present invention will be explained with reference to FIGS. 1A to 1F according to the process sequence thereof. With the nanoimprint method shown in the present example, a protrusion-depression pattern formed on a mold (for example, a Si mold) is transferred to a photocurable resin film obtained by curing a functional liquid (photocurable resin liquid) formed on a substrate (quartz substrate, or the like), and a micropattern is formed on the substrate by using the photocurable resin film as a master pattern.

Figure 1A:
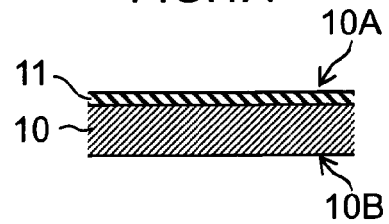
FIGS. 1A-1F illustrate steps of an imprint system in accordance with an embodiment of the present invention.

First, a quartz substrate 10 (referred to hereinbelow simply as "substrate") shown in FIG. 1A is prepared. A hard mask layer 11 is formed on a front surface 10A of the substrate 10 shown in FIG. 1A, and a micropattern is formed on the front surface 10A. The substrate 10 has a predetermined transmissivity allowing the substrate to transmit light such as UV radiation and may have a thickness of equal to or greater than 0.3 mm. Such light transmissivity makes it possible to conduct exposure from a rear surface 10B of the substrate 10.

Examples of substrates suitable as the substrate 10 used when a Si mold is used include substrates whose surfaces are covered with a silane coupling agent, substrates on which a metal layer constituted by Cr, W, Ti, Ni, Ag, Pt, Au, and the like, is stacked, substrates on which a metal oxide layer such as $CrO_2$, $WO_2$, and $TiO_2$ is laminated, and substrates whose surfaces are covered with a silane coupling agent.

Thus, a laminate (covered material) such as the aforementioned metal films or metal oxide films is used as the hard mask layer 11 shown in FIG. 1A. In cases where the thickness of the laminate exceeds 30 nm, the light transmissivity decreases and curing defects easily occur in the photocurable resin. Therefore, the laminate thickness is equal to or less than 30 nm, preferably equal to or less than 20 nm.

Figure 1B:
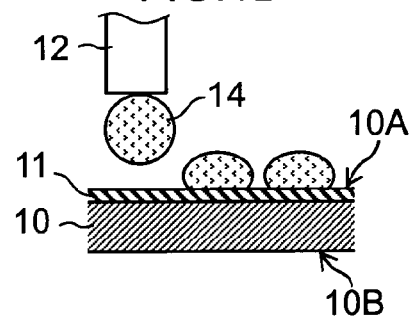
Figure 1C:
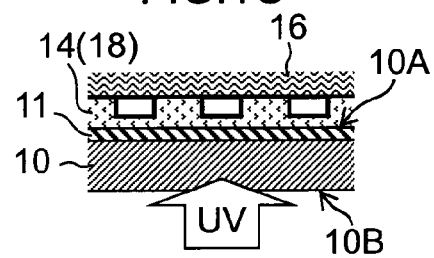

The "predetermined transmissivity" as referred to herein ensures that the light coming from the rear surface 10B of the substrate 10 can exit from the front surface 10A and that the functional liquid (for example, a liquid including the photocurable resin that is denoted by the reference numeral 14 in FIG. 1C) formed on the surface can be sufficiently cured. For example, desirably, the transmittance of light with a wavelength of equal to or greater than 200 nm that comes from the rear surface may be equal to or greater than 5%.

The structure of the substrate 10 may be a monolayer structure or a laminated structure. In addition to quartz, such materials as silicon, nickel, aluminum, glass, and resins can be used as appropriate for the substrate 10. These materials may be used individually or may be used as appropriate in combinations of two or more thereof.

The thickness of substrate 10 is preferably equal to or greater than 0.05 mm, more preferably equal to or greater than 0.1 mm. In cases where the thickness of the substrate 10 is less than 0.05 mm, it is possible that a deflection may occur on the substrate side and a uniform contact state may not be obtained when the mold and the body where the pattern is to be formed are brought into intimate contact. Further, with the object of avoiding fractures during handling or under pressure during imprinting, it is even more preferred that the thickness of the substrate 10 be equal to or greater than 0.3 mm.

A plurality of droplets 14 including a photocurable resin are discretely jetted out of an inkjet head 12 onto the front surface 10A of the substrate 10 (FIG. 1B: jetting step). The expression "droplets discretely jetted out" herein means that a plurality of droplets land with a predetermined spacing, without coming into contact with other droplets that land at the adjacent jetting positions (disposed positions) on the substrate 10 (this issue will be discussed below in greater detail).

The droplet ejection amount of droplets 14, ejected droplet density, and discharge (flying) speed of droplets are set (adjusted) in advance in the jetting step illustrated in FIG. 1B. For example, the droplet amount and ejected droplet density are adjusted so as to be relatively large in a region with a large spatial volume of depressions of the protrusion-depression pattern of a mold (denoted by the reference numeral 16 in FIG. 1C) and relatively small in a region with a small spatial volume of depressions and a region without the depressions. After the adjustment, the droplets 14 are disposed on the substrate 10 according to the predetermined landing (jetting) arrangement (pattern).

With the nanoimprint method shown in the present example, a plurality of nozzles (denoted by the reference numeral 120 in FIG. 7) provided in the inkjet head 12 are grouped correspondingly to the structure of the inkjet head 12, and jetting of droplets 14 is controlled for each of the groups. Further, the ejected droplet density of droplets 14 at the front surface 10A of the substrate 10 is changed in terms of two mutually substantially orthogonal directions according to the protrusion-depression pattern of the mold. In addition, the number of droplet ejection events is measured for each group and jetting of each group is controlled so as to obtain a uniform jetting frequency for each group. The specific features of such jetting control will be described below.

After the jetting step illustrated in FIG. 1B, the protrusion-depression pattern surface of the mold 16 where the protrusion-depression pattern has been formed is pressed against the front surface 10A of the substrate 10 with a predetermined pressing force, the droplets 14 present on the substrate 10 are expanded, and a photocurable resin film 18 constituted by the plurality of expanded droplets 14 joined together is formed (FIG. 1C: photocurable resin film formation step).

In the photocurable resin film formation step, the amount of residual gas can be reduced by pressing the mold 16 against the substrate 10 after the atmosphere between the mold 16 and the substrate 10 has been depressurized or evacuated. However, under high-vacuum atmosphere, the uncured photocurable resin film 18 may volatilize and a uniform film thickness may be difficult to maintain. Accordingly, the amount of residual gas may be reduced by using helium (He) atmosphere or He reduced-pressure the atmosphere as the atmosphere between the mold 16 and the substrate 10. Since He permeates the quartz substrate 10, the amount of the residual gas (He) that has been taken in is gradually reduced. Since a certain time is required for the He permeation, the He reduced-pressure atmosphere is more preferable.

The pressing force of the mold 16 is set within a range of from 100 kPa to 10 MPa. A relatively high pressing force enhances the resin flow, also enhances the compression of the residual gas and dissolution of the residual gas in the photocurable resin and the He permeation in the substrate 10, and leads to the improved tact time. However, in cases where the pressing force is too high, foreign matter may be pressed into and the mold 16 and the substrate 10 may be damaged when the mold 16 comes into contact with the substrate 10. For this reason, the pressing force of the mold 16 is set within the above-mentioned range.

The range of the pressing force of the mold 16 is more preferably not less than 100 kPa and not greater than 5 MPa, even more preferably not less than 100 kPa and not greater than 1 MPa. The reason why the pressing force is set to a value equal to or higher than 100 kPa is because the space between the mold 16 and the substrate 10 is filled with droplets 14 and the space between the mold 16 and the substrate 10 is pressurized under the atmospheric pressure (about 101 kPa) when imprinting is performed under the atmosphere.

Irradiation with UV radiation is then performed from the rear surface 10B of the substrate 10, the photocurable resin film 18 is exposed, and the photocurable resin film 18 is cured (FIG. 1C: the photocurable resin film curing step). In the present example, a photocurable system is illustrated in which the photocurable resin film 18 is cured by light (UV radiation), but another curing system may be also used. For example, it is possible to adopt a heating-curable system where a thermocurable resin film is formed by using a liquid including a thermocurable resin and the thermocurable resin film is cured by heating.

Figure 1D:
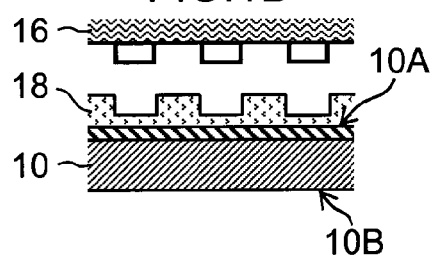

After the photocurable resin film 18 has been sufficiently cured, the mold 16 is separated from the photocurable resin film 18 (FIG. 1D: separation step). Any method that is unlikely to damage the pattern of the photocurable resin film 18 may be used for separating the mold 16. Thus, the mold may be separated gradually from the edge portion of the substrate 10, or the separation may be performed, while applying a pressure from the side of the mold 16, so as to reduce the force applied to the photocurable resin film 18 on a boundary line at which the mold 16 is separated from the photocurable resin film 18 (pressurization separation method). Further, a method (heating-assisted separation) can be also used in which the vicinity of the photocurable resin film 18 is heated, an adhesive force between the photocurable resin film 18 and the mold 16 at the interface of the mold 16 and the photocurable resin film 18 is reduced, the Young's modulus of the photocurable resin film 18 is reduced, resistance to embrittlement is improved, and fracture caused by deformation is inhibited. A composite method in which the abovementioned methods are combined as appropriate may be also used.

The protrusion-depression pattern formed on the mold 16 is transferred to the photocurable resin film 18 formed on the front surface 10A of the substrate 10 through the steps shown in FIGS. 1A to 1D. In the photocurable resin film 18 formed on the substrate 10, the ejected droplet density of droplets 14 that will form the photocurable resin film 18 is optimized according to physical properties of the liquid including the photocurable resin and the protrusion-depression state of the mold 16. Therefore, the uniformity of residual thickness is improved, and the desirable protrusion-depression pattern that is free of defects is formed. A fine pattern is then formed on the substrate 10 (or a metal film covering the substrate 10) by using the photocurable resin film 18 as a mask.

Figure 1E:
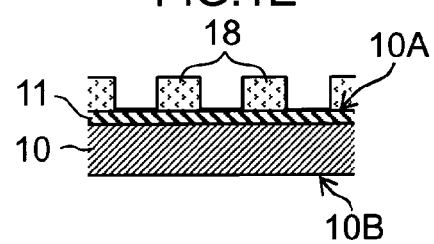
Figure 1F:

By transferring the protrusion-depression pattern of the photocurable resin film 18 located on the substrate 10, the photocurable resin located inside the depressions of the photocurable resin film 18 is removed, and the front surface 10A of the substrate 10 or the metal layer and the like formed on the front surface 10A is exposed (FIG. 1E: ashing step).

Further, the photocurable resin film 18 is removed by dry etching where the photocurable resin film 18 is used as a mask (FIG. 1F: etching step), and a fine pattern 10C corresponding to the protrusion-depression pattern formed on the photocurable resin film 18 is formed on the substrate 10. In cases where a metal film or a metal oxide film is formed on the front surface 10A of the substrate 10, the predetermined pattern is formed on the metal film or metal oxide film.

Any method may be used for dry etching, provided that this method can use the photocurable resin film as a mask. Specific examples of suitable methods include ion milling method, reactive ion etching (RIE), and sputter etching. Among these methods, ion milling method and reactive ion etching (RIE) are especially preferred.

The ion milling method is also called ion beam etching. In this method, ions are generated by introducing an inactive gas such as Ar into an ion source. The generated ions are accelerated when passing through a grid and collided with a sample substrate, thereby etching the substrate. Ion sources of a Kaufman type, a high-frequency type, an electron collision type, a duoplasmatron type, a Freeman type, and an ECR (electron cyclotron resonance) type can be used. Ar gas can be used as the process gas in ion beam etching, and fluorine-containing gas or chlorine-containing gas can be used as the etchant of RIE.

As described hereinabove, according to the formation of a fine pattern based on the nanoimprint method shown in the present example, the photocurable resin film 18 onto which the protrusion-depression pattern of the mold 16 has been transferred is used as a mask, and dry etching is performed by using the mask that is free from defects caused by thickness unevenness of the remaining film and residual gasses. Therefore, the fine patter can be formed on the substrate 10 with high accuracy and good yield.

Further, by using the above-described nanoimprint method, it is possible to fabricate a quartz substrate mold for use in the nanoimprint method.

<Explanation of Protrusion-Depression Pattern of Mold>

FIGS. 2A to 2E illustrate specific examples of the protrusion-depression pattern of the mold 16 shown in FIG. 1C. In the pattern shown in FIG. 2A, a plurality of protruding portions 20 having a substantially identical length in the A direction are arranged equidistantly parallel to each other with a predetermined spacing in the B direction perpendicular to the A direction. In the pattern shown in FIG. 2B, protruding portions 22 are divided as appropriate in the A direction. In the pattern shown in FIG. 2C, a plurality of protruding portions 24 having a length in the A direction shorter than the protruding portions 20 shown in FIG. 2A are arranged equidistantly parallel to each other with predetermined spacings in the A direction and B direction (the pattern in which the protruding portions 24 of a substantially identical shape are arranged equidistantly in the A direction and B direction).

When molds 16 are used that have formed thereon the protruding portions 20, 22, and 24 of such shapes, droplets 14 (see FIG. 1B) easily expand in the direction (A direction) of depressions 26 through the depressions 26 located between the protruding portions 20. As a result, anisotropy occurs and the expanded droplets assume a substantially elliptical shape.

In the pattern shown in FIG. 2D, protruding portions 28 having a substantially round planar shape are disposed equidistantly in the A direction, also disposed equidistantly in the B direction, and disposed more densely in the A direction than in the B direction so that the condition of "arrangement pitch in the A direction"<"arrangement pitch in the B direction" is satisfied. Where the mold 16 having the protruding portions 28 of such shape and arrangement pattern is used, droplets 14 also easily expand in the A direction. As a result, anisotropy occurs and the expanded droplets assume a substantially elliptical shape.

On the other hand, FIG. 2E illustrates a pattern in which protruding portions 28 having a substantially round planar shape are disposed equidistantly in the A direction and B direction so that the condition of "arrangement pitch in the A direction"="arrangement pitch in the B direction" is satisfied. Where the mold 16 having the protruding portions 28 of the shape shown in FIG. 2E, no clear anisotropy is observed in the expansion of droplets 14.

FIGS. 2A to 2D illustrate patterns with linear shape and arrangement of the protruding portions 20 (22, 24, 28), but the protruding portions may be also formed (disposed) along curved lines. Furthermore, the protruding portions may be formed (disposed) along zigzag (meandering) lines. The width (diameter) of the protruding portions 20 (22, 24, 28) and the width of depressions 26 are about 10 nm to 50 nm, and the height of protruding portions 20, 22, 24, 28 (depth of depressions 26) is about 10 nm to 100 nm.

<Explanation of Jetting Arrangement and Expansion of Droplets>

The jetting positions (landing positions) of droplets 14 that have landed on the substrate 10 in the jetting step illustrates by FIG. 1B and the expansion of droplets 14 in the photocurable resin film formation step illustrated by FIG. 1C will be explained below in greater detail.

Figure 3A:
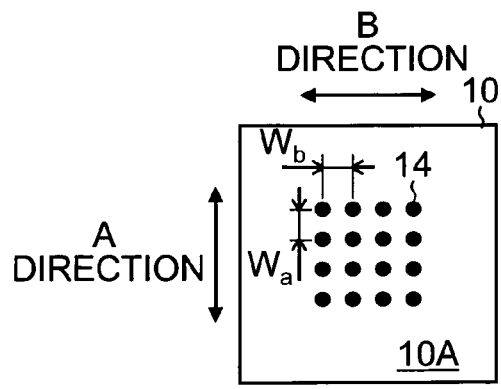
FIGS. 3A-3D illustrate one mode of arrangement and expansion of droplets.
Figure 3B:
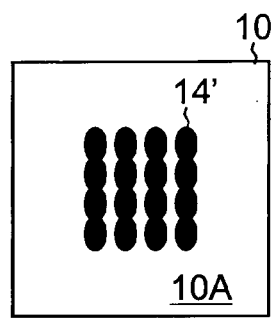
Figure 3C:
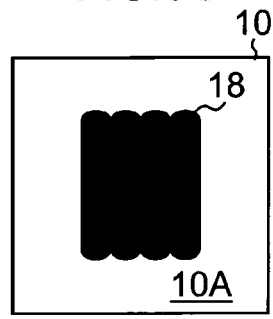

FIGS. 3A to 3C are explanatory drawings illustrating schematically a pattern of anisotropy in the expansion direction of droplets 14, wherein a stamper having the protrusion-depression pattern shown in FIGS. 2A to 2D is used. Droplets 14 shown in FIG. 3A are disposed so that the arrangement pitch in the A direction is $W_a$ and also disposed so that the arrangement pitch in the B direction is $W_b$ ($<W_a$).

The droplets 14 having an arrangement pattern such that the ejected droplet density of droplets in the A direction is sparser than that in the B direction, as shown in FIG. 3A, expand in a substantially elliptical shape with the A direction as a long axis direction and the B direction as a short axis direction, as shown in FIG. 3B. In FIG. 3B, an intermediate state where the droplets are being expanded is assigned with the reference numeral 14'. Where the droplets 14 are pressurized under predetermined conditions, the droplets 14 that have landed on the adjacent jetting positions coalesce with each other and a photocurable resin film 18 having a uniform thickness is formed, as shown in FIG. 3C.

Figure 3D:
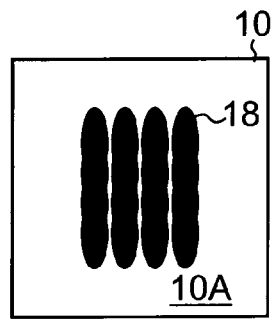

When the droplets 14 are disposed uniformly in the A direction and B direction, the wet spreading differs depending on the protrusion-depression shape of the stamper. Therefore, the density of droplets is determined in such a manner that no gap is formed therebetween (see FIG. 3D).

Figure 4A:
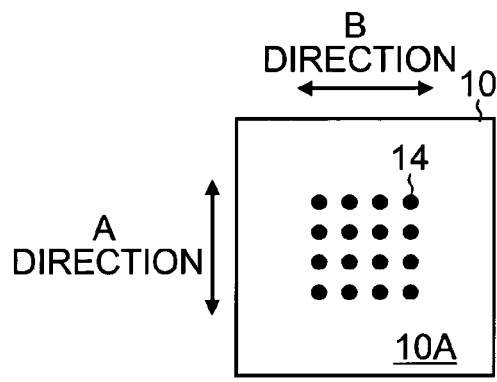
FIGS. 4A-4C illustrate another mode of arrangement and expansion of droplets.
Figure 4B:
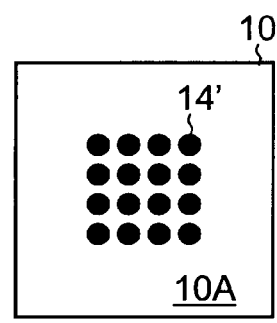
Figure 4C:
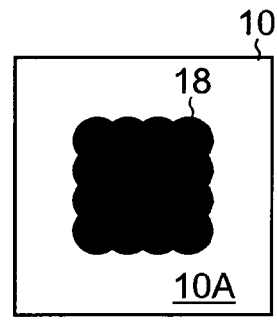

FIGS. 4A to 4C are explanatory drawings illustrating schematically one mode explaining how the droplets 14 which are disposed equidistantly in the A direction and B direction are expanded isotropically (uniformly). For example, the stamper having the protrusion-depression pattern shown in FIG. 2E is used.

The droplets 14 that have landed onto predetermined jetting positions on the front surface 10A of the substrate 10, as shown in FIG. 4A, are pressed against the mold 16 (see FIG. 1C) so as to expand substantially uniformly from the center in the radial direction as shown in FIG. 4B. In FIG. 4B, an expanded droplet in an intermediate state is assigned with the reference numeral 14'. Where the droplets 14 are pressurized under predetermined conditions, the droplets 14 that have landed at the adjacent jetting positions coalesce with each other and the photocurable resin film 18 having a uniform thickness is formed, as shown in FIG. 4C.

Figure 5A:
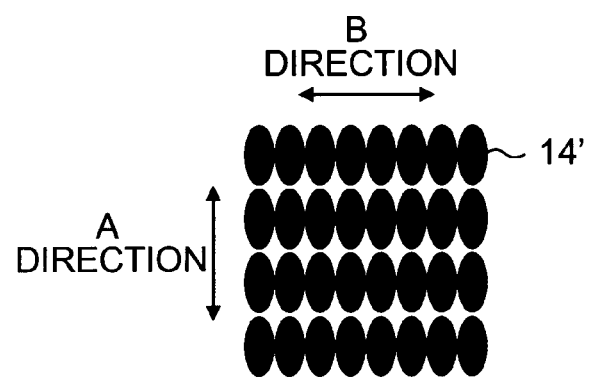
FIGS. 5A-5B illustrate other modes of arrangement of droplets.
Figure 5B:
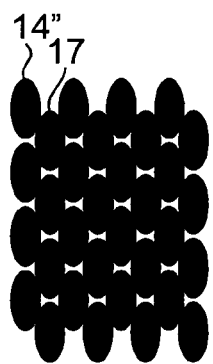

Desirably, the shape of each of a plurality of expanded droplets 14' (droplets of standard volume) that are shown in FIG. 5A can be approximated by an ellipse shape and the ellipsoidal droplets may be rearranged so that the ellipsoidal shapes are arranged in a close packing manner. In the example shown in FIG. 5B, positions of droplets 17 in the even rows in the A direction are changed (the droplet ejection pitch in the A direction is shifted by ½ pitch) so that the centers of droplets 17 in the even rows correspond to edges of droplets 14" in the odd rows in the A direction, and the positions in the B direction are changed (droplet ejection pitch in the B direction is decreased) so that the circular arc portions of the elliptical shapes of droplets 14" in the odd rows and circular arc portions of the elliptical shapes of droplets 17 in the even rows are brought into contact with each other in terms of the B direction.

The arrangement pattern of a plurality of droplets is determined by taking centers of the elliptical shapes after the rearrangement as grid nodes (jetting positions: deposition positions). As a result, in a method by which nanoimprinting is performed by applying photocurable droplets 14 according to an inkjet system, the occurrence of thickness unevenness of the remaining film of the photocurable resin film 18 onto which the protrusion-depression pattern has been transferred and the occurrence of defects caused by residual gas can be inhibited.

The desirable application amount of droplets 14 is within a range such that the thickness of the photocurable resin film 18 after pressurization with the mold 16 is not less than 5 nm and not greater than 200 nm. In particular, in order to improve the quality of pattern formed on the substrate 10 after a lithography process such as dry etching, which is a subsequent processing step, it is preferred that the thickness of the photocurable resin film 18 be equal to or less than 15 nm, more preferably equal to or less than 10 nm. It is even more preferred that the thickness of the photocurable resin film 18 be equal to or less than 5 nm. Further, the standard deviation value (σ value) of the residual film thickness is preferably equal to or less than 5 nm, more preferably equal to less than 3 nm, and even more preferably equal to or less than 1 nm.

<Explanation of Nanoimprint System>

A nanoimprint system for realizing the above-described nanoimprint method will be explained below.

(Entire Configuration)

Figure 6A:
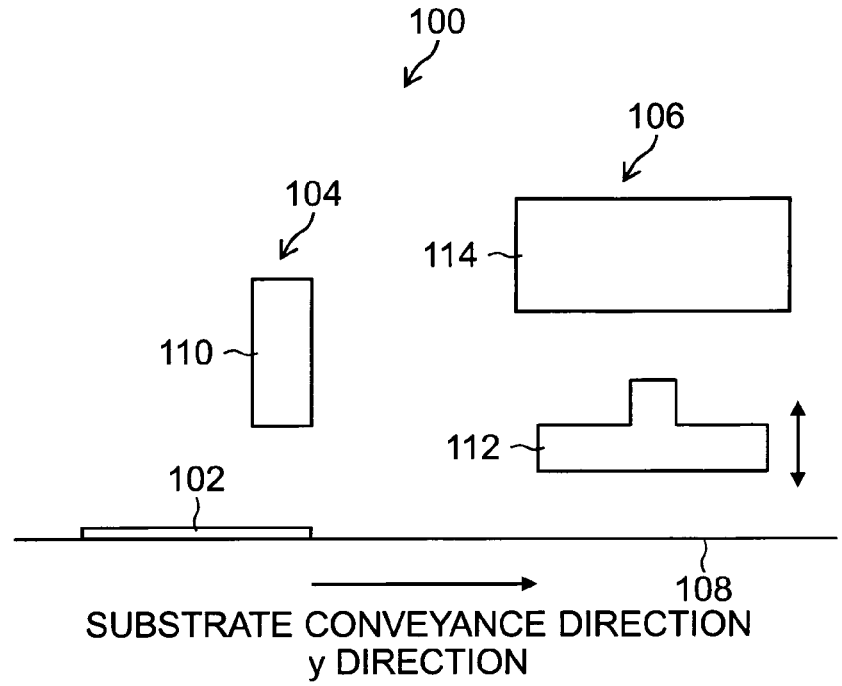
FIGS. 6A-6C are configuration diagrams of an entire imprint system in accordance with an embodiment of the present invention.
Figure 6B:
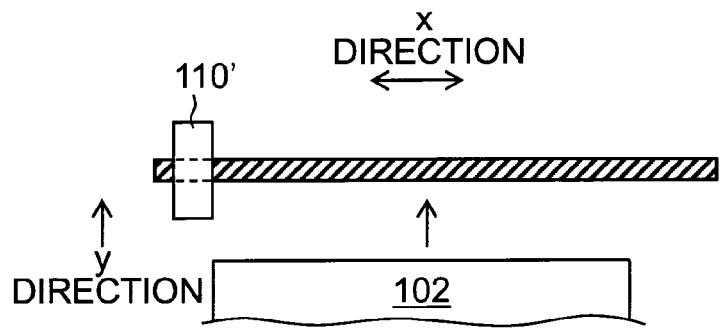
Figure 6C:
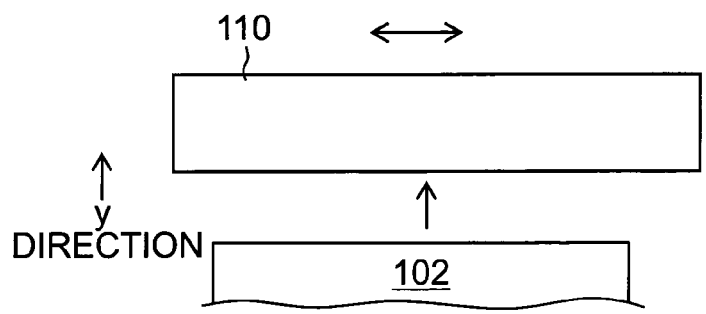

FIGS. 6A-6C are schematic configuration diagrams of a nanoimprint system of an embodiment of the present invention. A nanoimprint system 100 shown in FIGS. 6A-6C includes a resist application unit 104 that applies a liquid resist (liquid including a photocurable resin) onto a substrate 102 made from silicon or quartz glass, a pattern transfer unit 106 that transfers a desired pattern onto the resist applied to the substrate 102, and a conveying unit 108 that conveys the substrate 102.

The conveying unit 108 includes, for example, a conveying unit, such as a conveying stage, for fixing and conveying the substrate 102. The substrate 102 is conveyed from the resist application unit 104 in the direction toward the pattern transfer unit 106 (also referred to hereinbelow as "y direction", "substrate conveying direction", or "sub scanning direction"), while the substrate 102 is held on the surface of the conveying unit. Specific examples of the conveying unit can include a combination of a linear motor and an air slider and a combination of a linear motor and a LM guide. Instead of moving the substrate 102, it is also possible to move the resist application unit 104 and the pattern transfer unit 106, or to move both the substrate and the units. The "y direction" shown in FIGS. 6A-6C corresponds to the "A direction" in FIGS. 2 to 5.

The resist application unit 104 includes an inkjet head 110 having a plurality of nozzles formed therein (the nozzles are not shown in FIGS. 6A-6C and denoted by a reference numeral 120 in FIG. 7), and the liquid resist can be applied onto the surface of the substrate 102 (resist application surface) by discharging the liquid resist in the form of droplets from the nozzles.

The head 110 is a serial head having a structure in which a plurality of nozzles are arranged side by side in the y direction. With such a head, the liquid discharge in the x direction is performed, while scanning (moving) over the entire width of the substrate 102 in the x direction. According to the liquid discharge performed with the head 110' of a serial type as shown in FIG. 6B, after the liquid discharge in the x direction is completed, the substrate 102 and the head 110' are then moved relative to each other in the y direction and the next liquid discharge in the x direction is executed. Jetting is performed over the entire surface of the substrate 102 by repeating such operations. When the length of the substrate 102 in the y direction can be accommodated by a single scanning (movement) in the x direction, it is not necessary to move the substrate 102 and head 110' relatively in the y direction.

An elongated full-line head 110 such as shown in FIG. 6C can be also used. Such an elongated full-line head has a structure in which a plurality of nozzles are aligned in one row over the maximum width of the substrate 102 in the x direction (can be referred to hereinbelow as "substrate width direction" or "main scanning direction") perpendicular to the y direction. In liquid discharge using the head 110 of a full line type, droplets can be disposed at desired positions on the substrate 102 by performing one cycle of operation of moving the substrate 102 and the head 110 relative to each other in the substrate conveying direction, without moving the head 110 in the x direction. Therefore, according to a full line type head, the resist application speed can be increased. The abovementioned "x direction" corresponds to the "B direction" in FIGS. 2 to 5.

The pattern transfer unit 106 includes a mold 112 having a desired protrusion-depression pattern that should be transferred to the resist located on the substrate 102, and an ultraviolet radiation irradiation device 114 for radiating ultraviolet light. According to this pattern transfer unit 106, while the mold 112 is pressed against the surface of the substrate 102 coated with the resist, irradiation of the ultraviolet radiation is performed from the rear side of the substrate 102 so as to cure the liquid resist on the substrate 102. As a result, the pattern is transferred to the liquid resist on the substrate 102.

The mold 112 is made of a light-transmitting material that can transmit ultraviolet radiation emitted from the ultraviolet radiation irradiation device 114. For example, glass, quartz, sapphire, and transparent plastics (for example, acrylic resins and hard vinyl chloride) can be used as the light-transmitting material. As a result, when irradiation with ultraviolet radiation is performed from the ultraviolet radiation irradiation device 114 disposed above the mold 112 (on the side opposite that of the substrate 102), the liquid resist on the substrate 102 is irradiated with the ultraviolet radiation that is not blocked by the mold 112 and the liquid resist can be cured.

The mold 112 is configured to be movable in the up-down direction in FIG. 6A (direction shown by the arrow), and pattern transfer is performed by moving the mold 112 down while maintaining the state in which the pattern formation surface of the mold 112 is substantially parallel to the surface of the substrate 102, so as to press the mold 112 against the substrate 102 so that the mold 112 comes into contact substantially simultaneously with the entire surface of the substrate 102.

(Head Configuration)

Figure 8:
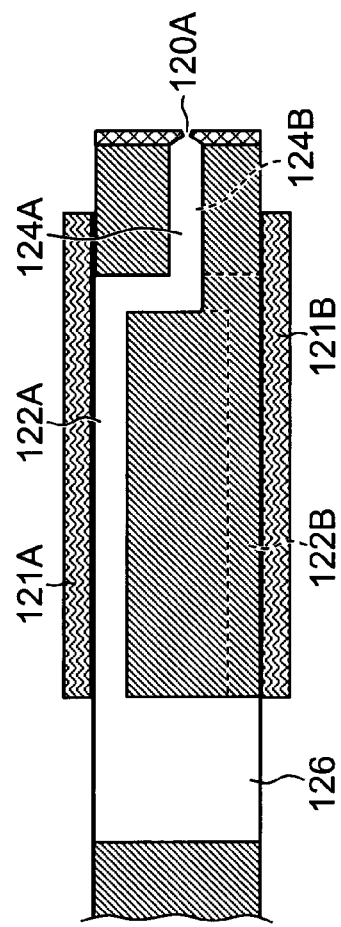
FIG. 8 is a cross-sectional view illustrating the head along line 8-8 in FIG. 7.

The structure of the head 110 will be explained below. FIG. 7 is a plan transparent view of the head 110 from the discharge surface (nozzle surface) side. FIG. 8 is a sectional view taken along line 8-8 in FIG. 7. As shown in FIG. 7, the head 110 has a structure in which a plurality of nozzles 120 are aligned side by side in a row along the entire length in the x direction (or y direction). The opening of each of the nozzles 120 is of a substantially square shape in the plan view thereof, and the direction of one side of the nozzle 120 is substantially parallel to the arrangement direction of the nozzles 120. In the explanation below, the full-line head 110 shown in FIG. 6C is considered, but the same explanation is applicable to the serial head 110' shown in FIG. 6B, provided that the x direction and y direction are replaced with each other.

Among the plurality of nozzles 120 in this structure, nozzles 120A with odd numbers when counted from the left side in FIG. 7, are connected via first communication channels 124A with a first liquid chamber 122A positioned on the upper side in FIG. 7, and nozzles 120B with even numbers when counted from the left side in FIG. 7, are connected via second communication channels 124B with a second liquid chamber 122B positioned on the lower side in FIG. 7. The first liquid chamber 122A is compartmentalized for each first nozzle 120A and the second liquid chamber 122B is compartmentalized for each second nozzle 120B (this compartmentalization is not shown in the figure).

Respective piezoelectric elements (assigned with reference symbols 121A and 121B in FIG. 8) are provided on the outside of the first liquid chamber 122A and on the outside of the second liquid chamber 122B, respectively (these piezoelectric elements are not shown in FIG. 7). The piezoelectric elements have an integrated piezoelectric body portion with respect to the first liquid chamber or second liquid chamber and also use an electrode-split structure in which an individual electrode (assigned with the reference numeral 140 in FIG. 10A) is provided for each nozzle (each compartment).

As shown in FIG. 8, the first liquid chamber 122A is connected with a liquid supply channel 126 on the side opposite that of the first communication channel 124A, and the second liquid chamber 122B is connected with the liquid supply channel 126 on the side opposite that of the second communication channel 124B. The first piezoelectric element 121A is provided on the outer surface of the first liquid chamber 122A, and the second piezoelectric element 121B is provided on the outside surface of the second liquid chamber 122B.

When the first piezoelectric element 121A is actuated, the liquid inside the first liquid chamber 122A is pressurized, and droplets are jetted out from the odd nozzles 120A in FIG. 7. When the second piezoelectric element 121B shown in FIG. 8 is actuated, the liquid inside the second liquid chamber 122B is pressurized, and droplets are jetted out from the even nozzles 120B in FIG. 7.

The head 110 of the present example has a structure in which the first liquid chamber is disposed at one side (upper side in the figure) of the nozzle row, and the second liquid chamber 122B is disposed at the other side (lower side in the figure), the nozzles are grouped into a group of nozzles 120A communicating with the first liquid chamber 122A and a group of nozzles 120B communicating with the second liquid chamber 122B correspondingly to the flow channel structure of the head 110, and jetting of droplets can be controlled for each group.

Figure 9:
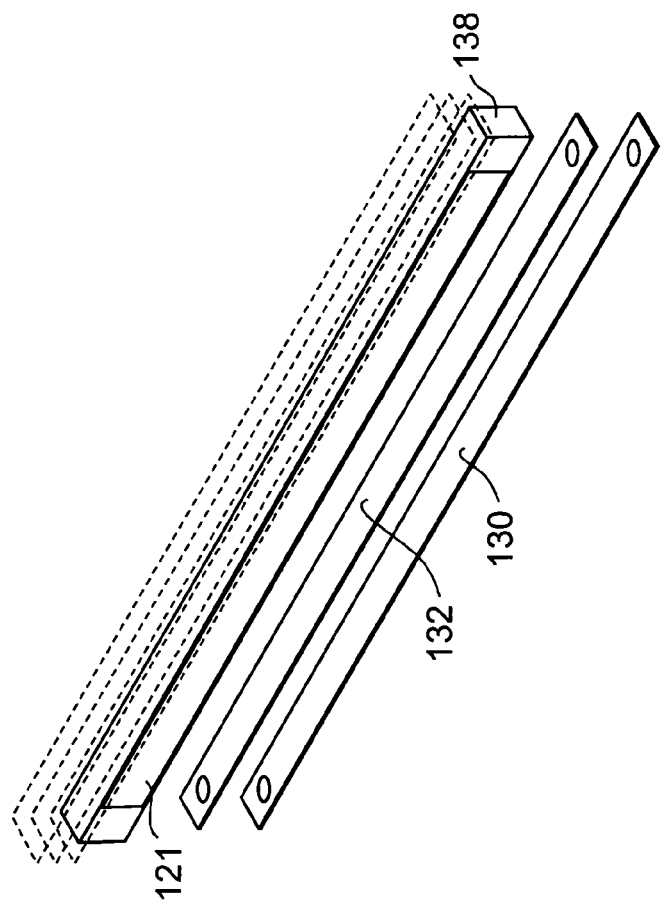
FIG. 9 is an exploded perspective view illustrating the configuration of the head shown in FIG. 7.

FIG. 9 is an exploded perspective view of the head 110. The head 110 shown in FIG. 9 has a structure in which a plurality of plates are stacked, and a spacer layer 132 having a portion of the communication channels 124 (124A, 124B) formed therein is stacked on the nozzle plate 130 where the nozzles 120 (see FIG. 8) are formed.

Further, a liquid chamber plate 138 having a portion of the communication channels 124 and the liquid chambers 122 (122A, 122B) formed therein is stacked on the spacer layer 132. The piezoelectric elements 121 (121A, 121B) are formed at side surfaces at both sides of the liquid chamber plate 138. Further, a supply channel plate (not shown in the figure) having the liquid supply channel 126 formed therein is stacked on the liquid chamber plate 138. An elongated head may be configured by taking the head 110 having such a structure as a head module and joining a plurality of head modules in the x direction.

Figure 10A:
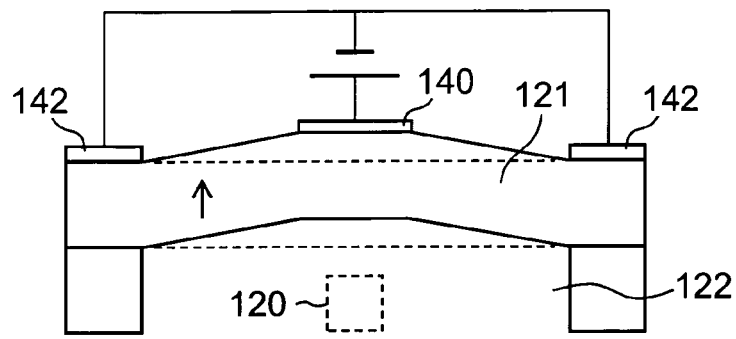
FIGS. 10A-10C each illustrate an operation mode of the piezoelectric elements used in the head shown in FIG. 7.

The head 110 used in the nanoimprint system shown in the present example is provided with piezoelectric elements 121 as a means for pressurizing the liquid chambers. FIG. 10A illustrates the operation mode ($d_{15}$ mode, share mode) of a piezoelectric element 121; this figure corresponds to the vertical section in FIG. 8. As shown in FIG. 10A, in the piezoelectric element 121, an individual electrode 140 and a common electrode 142 are provided at the surface on the side opposite that of the liquid chamber 122. Further, the piezoelectric element 121 is polarized in the direction (thickness direction) from the liquid chamber 122 outward (the polarization direction is shown by an arrow in the figure), the individual electrode 140 is taken as a positive electrode, and the common electrode 142 is taken as a negative electrode. Where a predetermined electric field is applied, the piezoelectric element 121 is deformed inward of the liquid chamber 122. In FIG. 10A, the stationary state (state in which no electric field is applied) is represented by solid lines, and the deformed state (state in which the electric field is applied) is represented by broken lines.

Figure 10B:
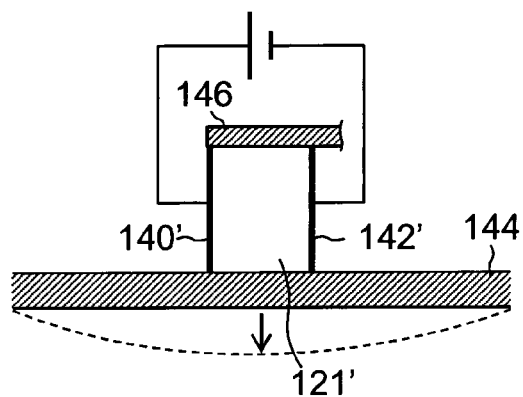
Figure 10C:
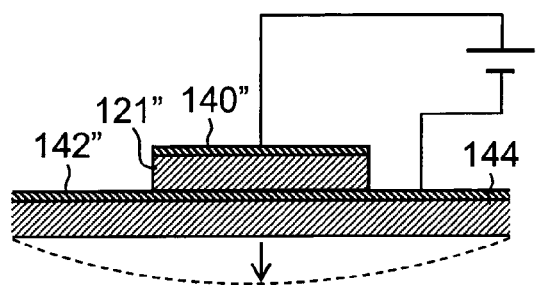

A $d_{33}$ mode that uses the displacement in the direction of elongating the piezoelectric element 121' as shown in FIG. 10B, and a $d_{31}$ mode that uses the displacement in the direction of shortening the piezoelectric element 121" as shown in FIG. 10C, can be also used.

For example, the piezoelectric element 121' shown in FIG. 10B is provided at the outer wall 144 of the liquid chamber 122 and has a structure in which a restraining plate 146 is mounted on the surface on the side opposite that of the outer wall 144 of the liquid chamber 122. In addition, an individual electrode 140' and a common electrode 142' are provided at the surfaces perpendicular to the surface for mounting on the outer wall 144 of the liquid chamber 122. Where an electric field in the direction from the individual electrode 140' to the common electrode 142' is applied to the piezoelectric element 121' shown in FIG. 10B, the piezoelectric element 121' extends in the vertical direction and the outer wall 144 of the liquid chamber 122 is deformed inward.

When a piezoelectric element 121" shown in FIG. 10C is used, a common electrode 142" is provided at the surface on the outer wall 144 side of the liquid chamber 122, and an individual electrode 140" is provided at the surface on the side opposite that of the common electrode 142". Where an electric field is applied in the direction from the individual electrode 140" to the common electrode 142", the piezoelectric element 121" is shortened in the transverse direction of the piezoelectric element 121" and the outer wall 144 of the liquid chamber 122 is deformed inward.

FIG. 11 is a plan view illustrating the arrangement of the individual electrode 140 and the common electrode 142 in the case of using the piezoelectric element 121 of a $d_{15}$ mode shown in FIG. 10A. As shown in FIG. 11, the common electrode 142 has a comb-like planar shape, and the individual electrodes 140 are disposed between the common electrodes 142. The arrangement positions of the individual electrodes 140 correspond to the positions of nozzles 120.

Figure 12:
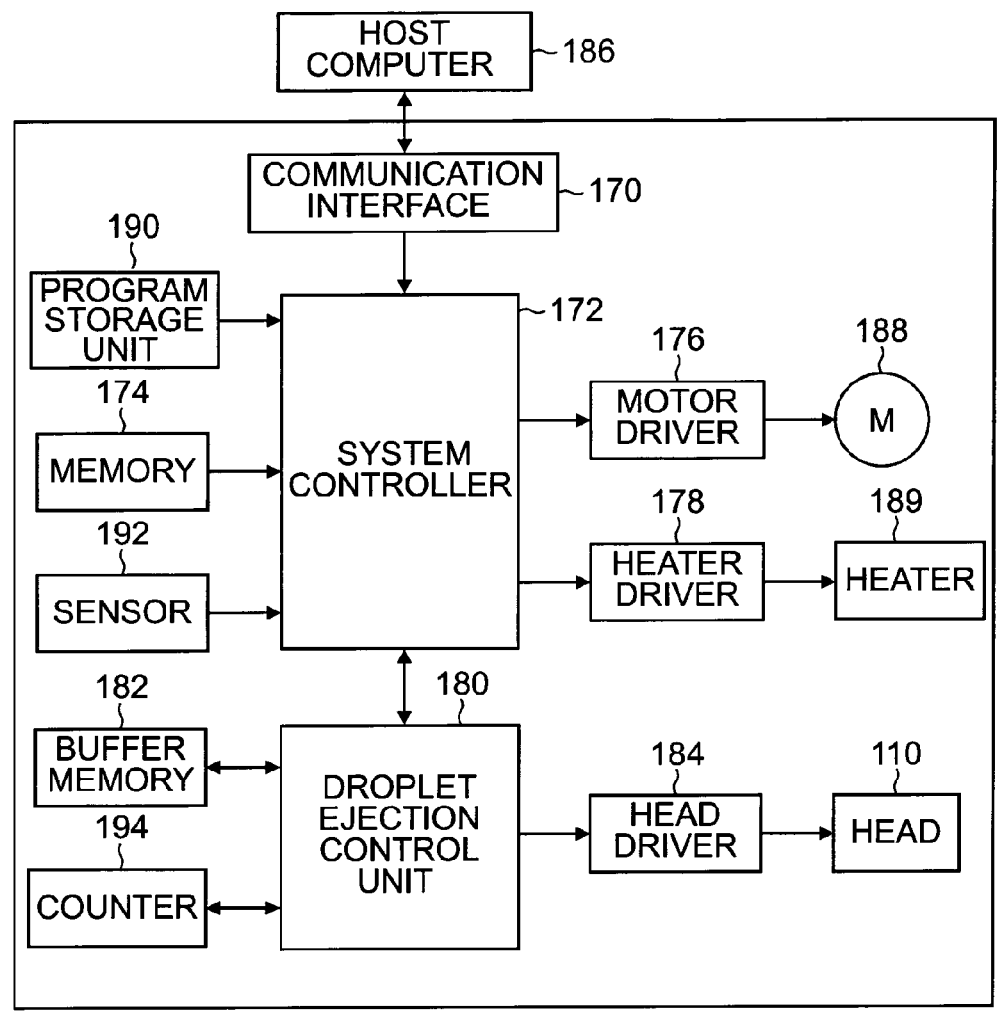
FIG. 12 is a principal block diagram illustrating the control system of the imprint system shown in FIGS. 6A-6C.

The individual electrodes 140, 140', 140" and common electrodes 142, 142', 142" shown in FIGS. 10A to 10C and FIG. 11 are led out to the outside of the head 110 by using a flexible board (not shown in the figure) and electrically connected to a head driver (denoted by the reference numeral 184 in FIG. 12).

(Explanation of Control System)

FIG. 12 is a block diagram illustrating a control system relating to the resist application unit 104 in the nanoimprint system 100. As shown in the figure, the control system includes a communication interface 170, a system controller 172, a memory 174, a motor driver 176, a heater driver 178, a droplet ejection control unit 180, a buffer memory 182, and a head driver 184.

The communication interface 170 is an interface unit that receives data representing the arrangement (application distribution) of liquid resist that are sent from a host computer 186. A serial interface such as a USB (Universal Serial Bus), IEEE 1394, Ethernet (registered trade name), and wireless network, or a parallel interface such as Centronix can be used as the communication interface 70. A buffer memory (not shown in the figure) for increasing the communication speed may be installed in this portion.

The system controller 172 is a control unit that controls other units such as the communication interface 170, memory 174, motor driver 176, and heater driver 178. The system controller 172 is constituted by a central processing unit (CPU) and peripheral circuits thereof, controls communication with the host computer 186, performs writing/reading control of the memory 174, and generates control signals that control the motor 188 of the conveying system and the heater 189.

The memory 174 is a storage unit that is used as a temporary storage region for data and an operation region when the system controller 172 performs various calculations. Data representing the arrangement of liquid resist that are inputted via the communication interface 170 are taken into the nanoimprint system 100 and stored temporarily in the memory 174. A memory constituted by semiconductor elements and also a magnetic medium such as a hard disk can be used as the memory 174.

The program storage unit 190 stores control programs of the nanoimprint system 100. The system controller 172 reads, as appropriate, the control programs stored in the program storage unit 190 and executes the control programs. A semiconductor memory such as ROM or EEPROM, or a magnetic disk may be used as the program storage unit 190. The program storage unit may be provided with an external interface and a memory card or PC card may be used. It goes without saying that a plurality of storage media may be provided among these storage media.

The motor driver 176 is a driver (drive circuit) that drives the motor 188 according to commands from the system controller 172. The motor 188 includes a motor for driving the conveying unit 108 shown in FIGS. 6A-6C and a motor for raising and lowering the mold 112.

The heater driver 178 drives the heater 189 according to commands from the system controller 172. The heater 189 includes heaters for temperature adjustment that are provided in units of the nanoimprint system 100.

The droplet ejection control unit 180 has a signal processing function of performing processing of various kinds and correction for generating signals for jetting control from the arrangement data of liquid resist stored in the memory 174 according to the control of the system controller 172 and supplies the generated jetting control signals to the head driver 184. The required signal processing is implemented in the droplet ejection control unit 180 to control the droplet ejection amount of liquid resist jetted out from the head 110, jetting positions, and jetting timing of the head 110 via the head driver 184 on the basis of the jetting data. As a result, the desired arrangement (distribution) of liquid resist droplets is realized.

The buffer memory 182 is provided with the droplet ejection control unit 180, and data such as jetting data and parameters are temporarily stored in the buffer memory 182 when jetting data processing is performed in the droplet ejection control unit 180. FIG. 12 shows a configuration in which the droplet ejection control unit 180 is provided with the buffer memory 182, but the memory 174 can be used as the buffer memory. Further, a configuration constituted by a single processor in which the droplet ejection control unit 180 and the system controller 172 are unified can be also used.

The head driver 184 generates drive signals for driving the piezoelectric elements 121 (see FIG. 4) of the head 110 on the basis of the jetting data supplied from the droplet ejection control unit 180 and supplies the generated drive signals to the piezoelectric elements 121. A feedback control system for maintaining constant drive conditions of the head 110 may be included in the head driver 184.

The sensor 192 is provided for detecting the flying state of droplets jetted out from the head 110. The sensor 192 may have a configuration including a light-generating unit (for example, a strobo device that generates strobo light (electronic flash)) and a light-receiving unit (for example, an image pick-up device such as a CCD image sensor). The flying speed of droplets, flying direction of droplets, and volume of droplets can be detected with such an optical sensor. Information obtained with the sensor 192 is sent to the system controller 172 and also sent by feedback to the droplet ejection controller 172.

The counter 194 counts the number of droplet ejection events for each group that has been set for each nozzle 120. In the present example, the number of droplet ejection events for each group is counted on the basis of jetting data, and the count data are stored in the predetermined storage unit (for example, the memory 174). By using these count data, it is possible to adjust the usage frequency for each group so as to avoid bias in the number of droplet ejection events for each group. For example, the group selection can be changed to prevent the deviation to only the first nozzle 120A or only the second group.

(Explanation of Drive Voltage)

As described hereinabove, in the present example, the nozzles 120 in the head 110 are grouped and include nozzles 120A (referred to hereinbelow as "nozzles belonging to the first group") that communicate with the first liquid chamber 122A and nozzles 120B (referred to hereinbelow as "nozzles belonging to the second group") that communicate with the second liquid chamber 122B.

In the head 110 shown in the present example, the drive voltage applied to the piezoelectric elements 121 corresponding to the nozzles 120A belonging to the first group (referred to hereinbelow as "piezoelectric elements belonging to the first group") can be made different from the drive voltage applied to the piezoelectric elements 121 corresponding to the nozzles 120B belonging to the second group (referred to hereinbelow as "piezoelectric element belonging to the second group").

Figure 13:
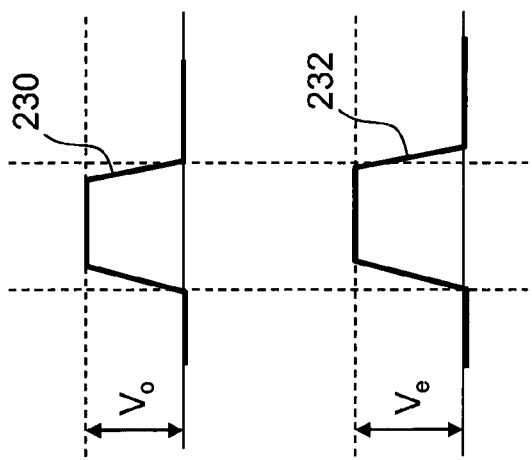
FIG. 13 illustrates an example of a drive voltage used in the head shown in FIG. 7.

FIG. 13 illustrates a specific example in which the drive voltage is changed to change the droplet ejection amount for each group. The upper drawing in FIG. 13 shows a drive voltage waveform 230 applied to a piezoelectric element belonging to the first group, and the lower drawing shows a drive voltage waveform 232 applied to a piezoelectric element belonging to the second group. The drive voltage waveforms 230, 232 shown in the figure act in a pull-push manner upon the piezoelectric element 121 (see FIG. 8). The drive voltage waveform 230 has the maximum voltage $V_o$, and the drive voltage waveform 232 has the maximum voltage $V_e$ ($V_e > V_o$ or $V_e < V_o$).

Thus, the maximum value of the drive voltage applied to the drive piezoelectric elements 121 can be changed according to each group. Where the maximum value of the drive voltage is made relatively large, the droplet ejection amount becomes relatively large, and where the maximum value of the drive voltage is made relatively small, the droplet ejection amount becomes relatively small. The configuration in which the head driver 184 shown in FIG. 12 is provided with a voltage variation unit correspondingly to the group assigned to the piezoelectric element 121 (nozzle 120) is an example of configuration for changing the maximum value of drive voltage.

By changing the maximum value of drive voltage, it is possible to correct the variation in the discharge amount associated with individual variation (thickness, piezoelectric constant, Young's modulus and the like) of piezoelectric elements. Further, by adjusting the pulse width of drive voltage, it is possible to correct the discharge efficiency of each nozzle that depends on the variation in resonance frequency of the head associated with individual variation of piezoelectric elements, correct the discharge stability of each nozzle, and improve the discharge efficiency and discharged stability of the entire head.

In a specific example of changes in the drive voltage (drive waveform), the discharge characteristic of each nozzle (each nozzle row) is inspected and stored in advance and the drive voltage is changed with reference to the data on the discharge characteristic for each nozzle (each nozzle row). The below-described "detection of jetting state" can be used for inspecting the discharge characteristic of each nozzle.

(Explanation of Jetting Arrangement in X Direction)

The jetting arrangement (droplet ejection pitch) of liquid resist in the x direction will be explained below.

When jetting is performed from the nozzles 120A belonging to the first group, the nozzles 120B belonging to the second group are idle, and when jetting is performed from the nozzles 120B belonging to the second group, the nozzles 120A belonging to the first group are idle. Thus, the minimum droplet ejection pitch in the x direction is twice as large as the minimum nozzle pitch (minimum nozzle pitch in each group) in the x direction. For example, when the minimum droplet ejection pitch in the x direction is 400 μm, droplets with a diameter of about 50 μm are discretely disposed with a pitch of 400 μm in the x direction. Further, it is also possible to regroup each group into n groups (n is a positive integer) and obtain a minimum droplet ejection pitch of 400/n (μm).

Simultaneous jetting can be also performed from the nozzles 120A belonging to the first group and the nozzles 120B belonging to the second group. In such a mode, the minimum droplet ejection pitch is equal to the minimum nozzle pitch.

Figure 14A:
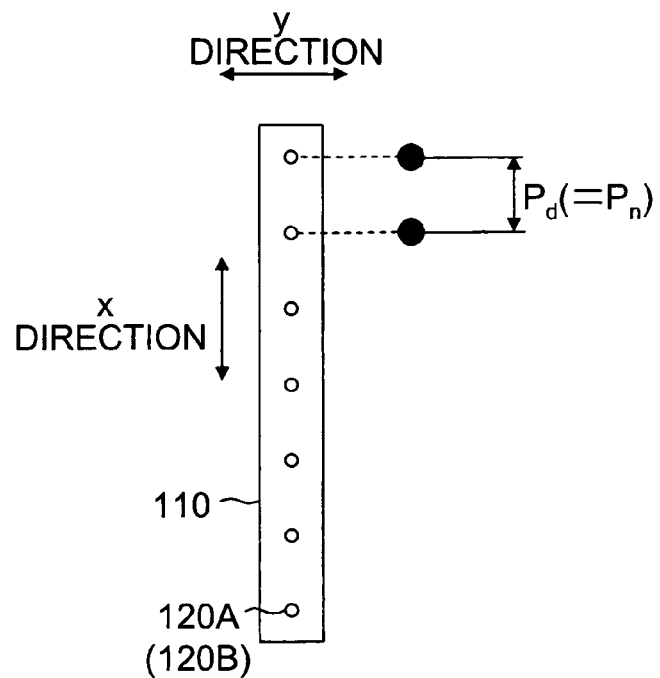
FIGS. 14A-14B illustrate changes in ejected droplet density in the x direction that are used in the imprint system shown in FIGS. 6A-6C.
Figure 14B:
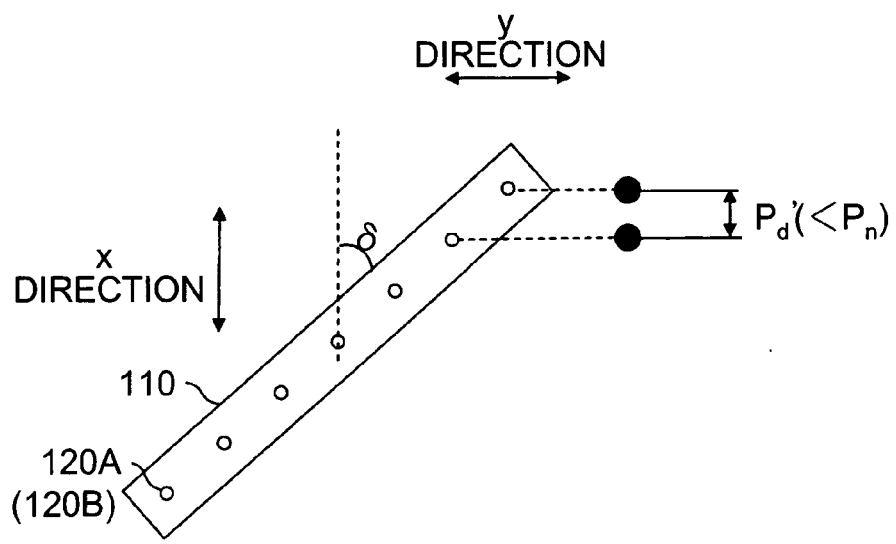

In the head 110 of the present example, the droplet ejection pitch can be finely adjusted in terms of the x direction within a range less than the minimum droplet ejection pitch, and the ejected droplet density of droplets can be finely changed in the x direction. FIGS. 14A and 14B are schematic diagrams illustrating a specific example of configuration for finely adjusting the droplet ejection pitch in the x direction. The below-described unit for finely adjusting the droplet ejection pitch in the x direction is configured to adjust finely the droplet ejection pitch in the x direction by rotating the head 110 in a plane substantially parallel to the plane of the substrate 102 (see FIGS. 6A-6C) onto which the droplets are jetted.

In the head 110 shown in FIG. 14A, only the nozzles 120A of the first group (or the nozzle 120B of the second group) are shown, and the nozzles 120A of the first group are arranged equidistantly with an arrangement pitch $P_n$. Actually, the nozzles 120B of the second group are disposed between the nozzles 120A shown in the figure.

In this case, the droplet ejection pitch $P_d$ (corresponds to $W_d$ shown in FIG. 3A) in the x direction is equal to the nozzle pitch $P_n$ in the x direction. As shown in FIG. 14B, by rotating the head 110 so as to assume the angle δ against the x direction, the droplet ejection pitch in the x direction can be changed from $P_d$ to $P_d'$ (=$P_n \times \cos \delta$ (where 0°<δ<45°)). With the unit for finely adjusting the droplet ejection pitch in the x direction of such a configuration, it is possible to adjust finely the minimum droplet ejection pitch in the x direction within a range below $P_d$, without changing the nozzles performing the jetting. For example, when the minimum droplet ejection pitch is $P_d$=400 μm, where the head 110 is rotated so as to obtain δ=28.9°, the droplet ejection pitch Pd' will be 350 μm.

Figure 15:
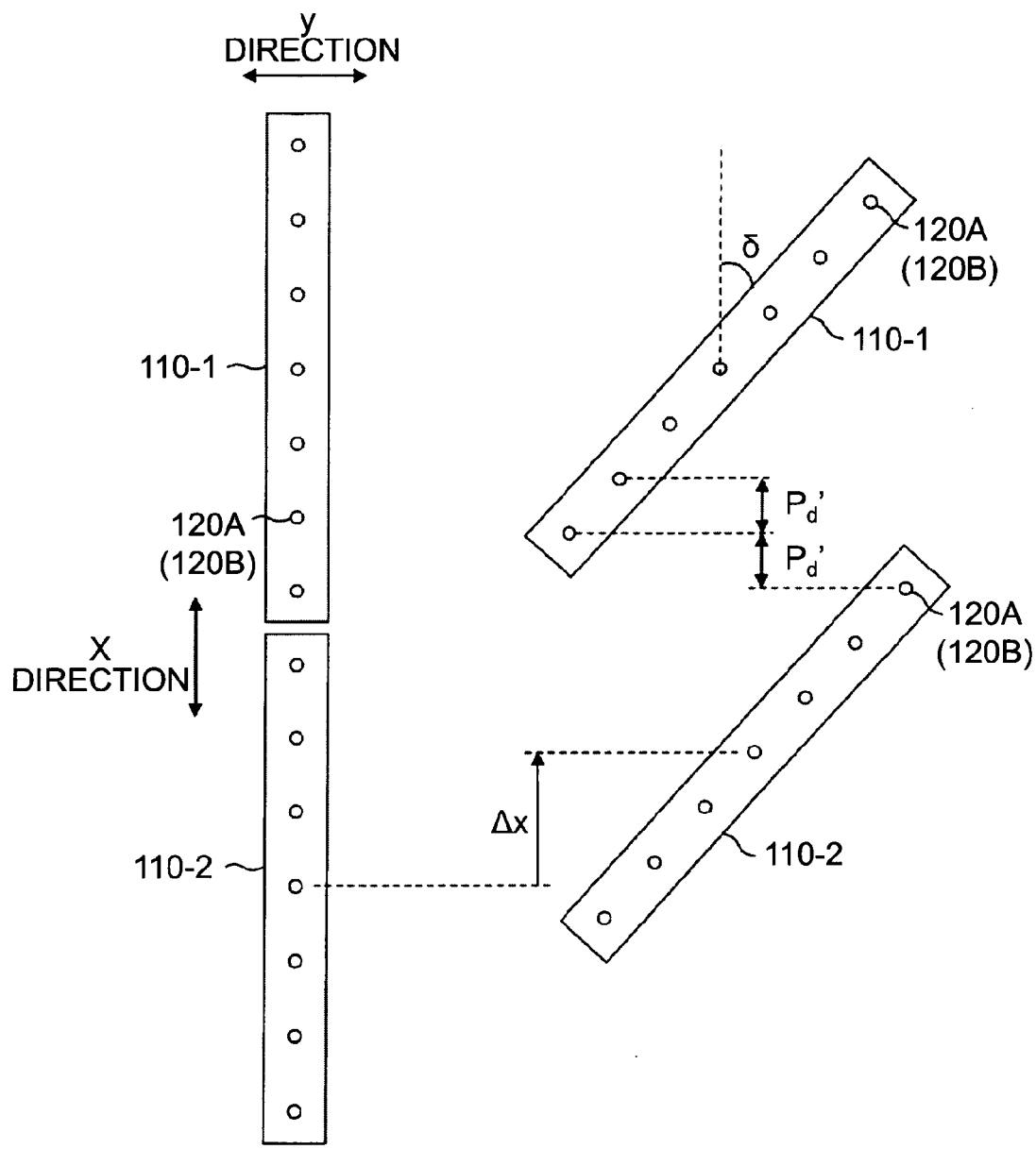
FIG. 15 illustrates another mode of ejected droplet density changes shown in FIG. 14.

FIG. 15 shows schematically the configuration of the unit for finely adjusting the droplet ejection pitch in the x direction in the case in which one elongated head is configured by combining two (a plurality of) head modules, namely, a head module 110-1 and a head module 110-2 in the x direction. These head modules 110-1, 110-2 are rotated and either of the head modules 110-1, 110-2 is moved by Δx in the x direction so as to obtain a droplet ejection pitch of $P_d'$ in the joining portion of the head modules 110-1, 110-2. It is also possible to move both head modules 110-1, 110-2 in the x direction.

Thus, where the elongated head is configured by joining a plurality of head modules 110-1, 110-2 in the x direction, a rotation mechanism is provided for the rotation for each of the head modules 110-1, 110-2 in the xy plane and also an x direction movement mechanism is provided for changing the relative distance between the adjacent head modules 110-1, 110-2 in the x direction.

In the configurations shown by way of example in FIGS. 14A, 14B, and 15, the head 110 is rotated about a rotation shaft passing substantially through the center of the head 110, but the head 110 may be also rotated about a rotation shaft passing through an end portion of the head 110. Further, a configuration provided with a motor (gear and motor) attached to the rotation shaft and a head support mechanism that supports the head 110 rotatably with respect to the rotation shaft can be employed as a specific example of configuration that rotates the head 110.

With the unit for finely adjusting the droplet ejection pitch in the x direction of the above-described structure, where the droplet ejection pitch $P_d$ in the x direction is finely adjusted, the droplet ejection pitch in the y direction also changes. Therefore, it is necessary to adjust finely the droplet ejection pitch in the y direction according to the fine adjustment amount in the x direction. Fine adjustment of the droplet ejection pitch in the y direction can be performed by the below-described method.

(Explanation of Jetting Arrangement in Y Direction)

A specific example of jetting arrangement in the y direction and of fine adjustment of droplet ejection pitch in the y direction will be explained below. With the head 110 of the present example, jetting can be performed in one cycle at one jetting timing with respect to the entire width in the x direction. With such a structure, droplets can be jetted out onto the entire region of the substrate 102 by causing one cycle of relative movement of the head 110 and the substrate 102.

When the substrate 102 is moved at a constant speed in the y direction with respect to the fixed head 110, the minimum droplet ejection pitch in the y direction becomes (minimum jetting period)×(movement speed of the substrate 102). Thus, the droplet ejection pitch in the y direction can be adjusted for each interval that is m times (m is a positive integer) the jetting period, without changing the jetting nozzle. Further, where the movement speed of the substrate 102 is increased, the droplet ejection pitch in the y direction also increases, and where the movement speed of the substrate 102 is decreased, the droplet ejection pitch in the y direction decreases.

The head 110 shown in the present example is also provided with a droplet ejection pitch fine adjustment unit for finely adjusting the droplet ejection pitch within a range less than (minimum jetting period)×(movement speed of the substrate) with respect to the y direction.

Figure 16:
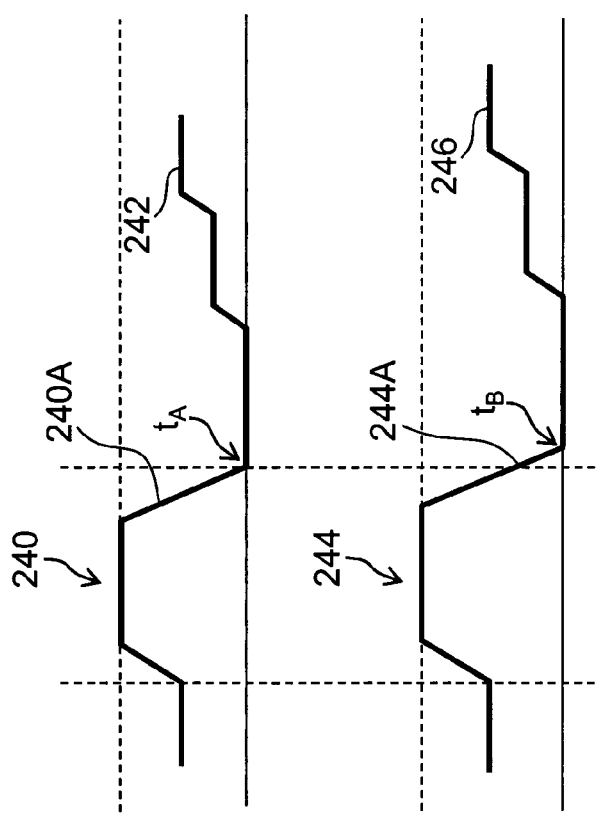
FIG. 16 illustrates another example of drive voltage used in the head shown in FIG. 7.

A drive voltage waveform 240 used in the case of performing jetting with a standard droplet ejection pitch in the y direction is shown in the upper portion of FIG. 16. The drive voltage waveform 240 exerts a pull-push action upon the piezoelectric elements 121 (see FIG. 8) and a meniscus stationary waveform 242 is applied. A drive voltage waveform 244 used in the case of performing fine adjustment of the droplet ejection pitch in the y direction is shown in the lower portion of FIG. 16. Similarly to the drive voltage waveform 240, this drive voltage waveform 244 exerts a pull-push action upon the piezoelectric element 121 and a meniscus stationary waveform 246 is applied.

In the drive voltage waveform 244 shown in the lower portion in the figure, a predetermined delay time is added to the drive voltage waveform 240 shown in the upper portion of the figure, and a delay phase is obtained. Therefore, the end timing $t_B$ of the waveform element (falling portion) 244A of the drive voltage waveform 244 which exerts a pushing action upon the piezoelectric element 121 is delayed with respect to the end timing $t_o$ of the waveform element (falling portion)

240A of the drive voltage waveform 240 which exerts a pushing action upon the piezoelectric element 121. By differentiating the drive voltage waveform and adjusting finely the discharge timing in this way, it is possible to adjust finely the droplet ejection pitch in the y direction.

Further, where the delay time is added and the phase is changed as in the drive voltage shown in the lower portion in FIG. 16, the spread in discharge amount caused by individual spread (thickness, piezoelectric constant, and Young's modulus) of piezoelectric elements can be corrected, and in addition, the uniformity of spread in discharge efficiency for each nozzle that depends on the spread in resonance frequency of the head caused by the individual spread of piezoelectric elements and the uniformity of spread of discharge stability of each nozzle can be improved.

Figure 17:
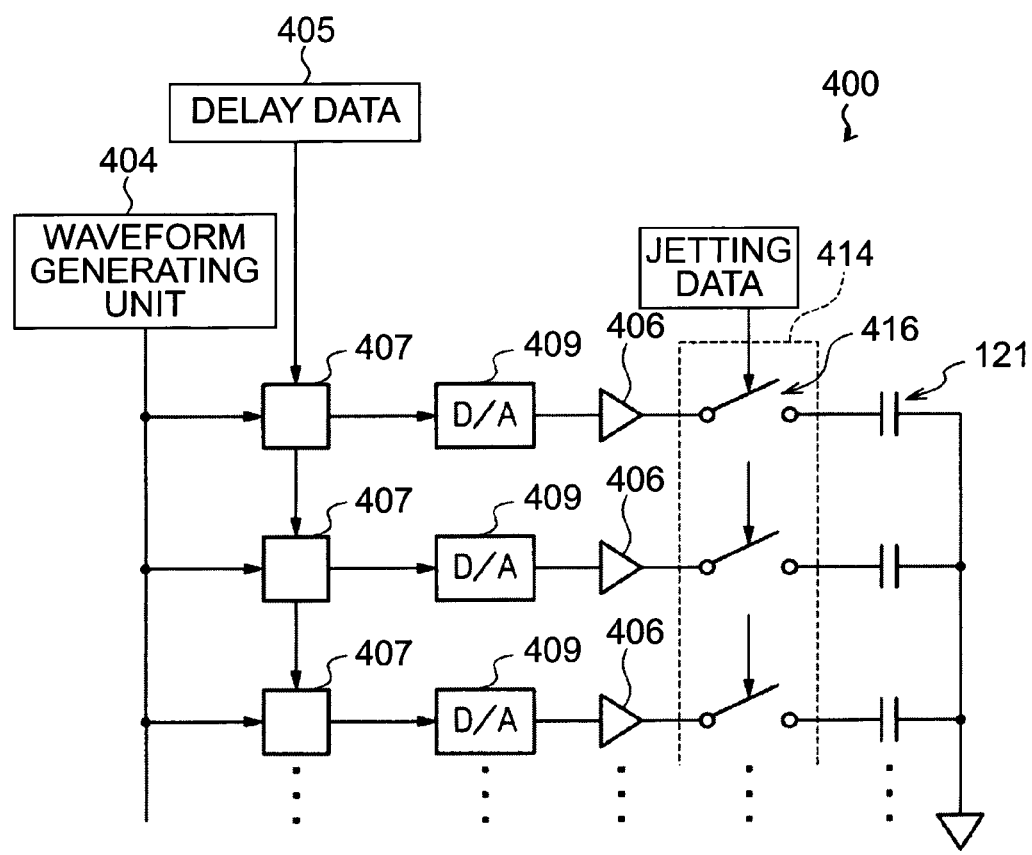
FIG. 17 is a block diagram illustrating the schematic configuration of a drive signal generation unit used in the imprint system shown in FIGS. 6A-6C.

FIG. 17 is a block diagram illustrating the configuration for adding the delay time (delay) to the standard drive voltage. A drive signal generating unit 400 shown in the figure includes a waveform generating unit 404 that generates a drive waveform for each nozzle 120, a delay data generating unit 405 that calculates the delay time for each nozzle when changing the droplet ejection pitch in the x direction, an addition unit 407 that adds the delay time generated by the delay data generating unit 405 to the drive waveform data, a D/A converter 409 that converts the drive waveform data in the digital format into analog format, and an amplifier 406 that performs voltage amplification processing and current amplification processing of the drive voltage in the analog format.

Where the piezoelectric elements 121 corresponding to the respective nozzles are actuated by ON/OFF switching of a switching element 416 of a switch IC 414 on the basis of jetting data, the resist liquid is jetted out from desired nozzles.

Figure 18:
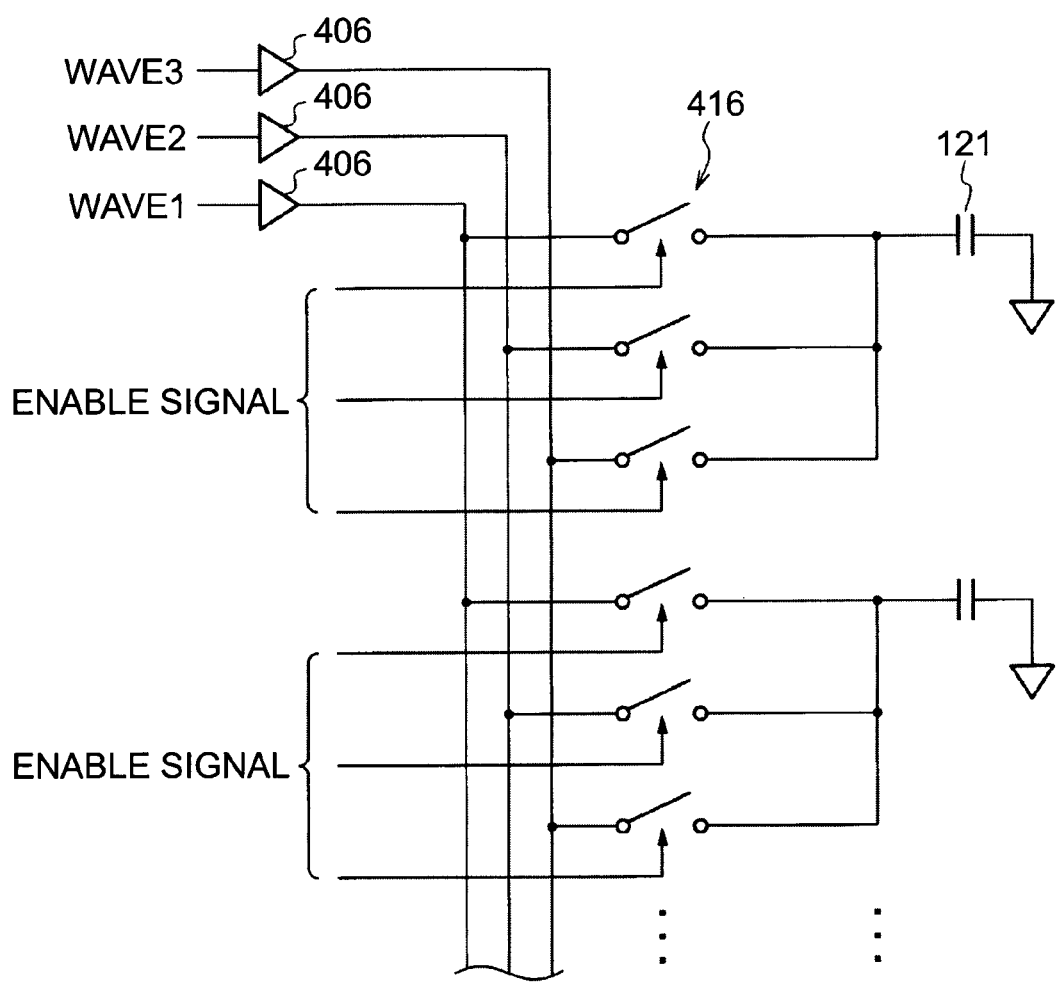
FIG. 18 is a block diagram illustrating another embodiment of the drive signal generation unit shown in FIG. 17.

A configuration may be also used in which a plurality of analog waveforms (WAVE 1 to 3) are prepared as shown in FIG. 18 and one analog waveform is selected from the plurality of analog waveforms according to an enable signal. Such a configuration can be used as a means for finely adjusting the droplet ejection pitch in the y direction and can be actuated independently of the means for finely adjusting the droplet ejection pitch in the x direction.

Figure 19A:
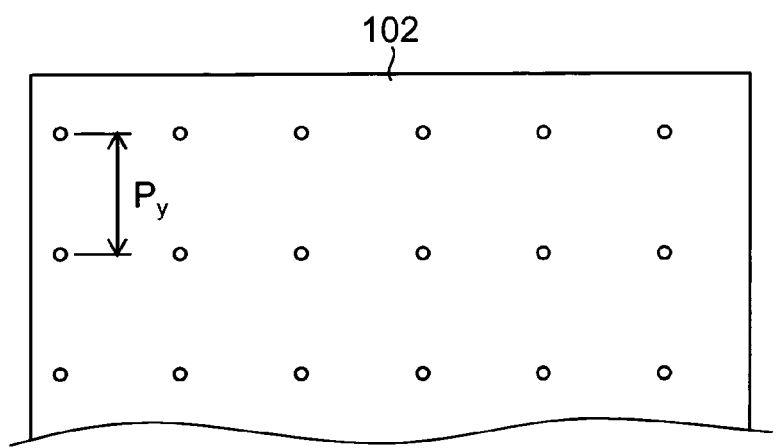
FIGS. 19A-19B illustrate fine adjustment of jetting position in the y direction.
Figure 19B:
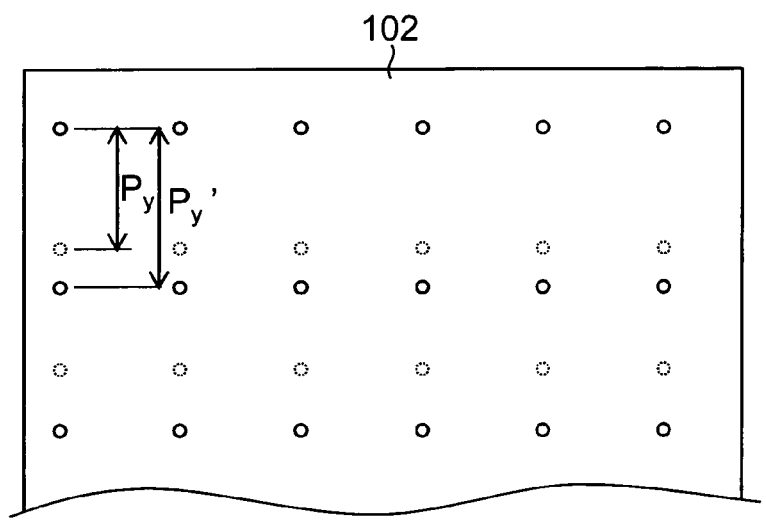

FIG. 19A shows jetting positions on the substrate 102 prior to fine adjustment of the droplet ejection pitch in the y direction. FIG. 19B shows the jetting positions on the substrate 102 after the fine adjustment of the droplet ejection pitch in the y direction. As shown in FIGS. 19A and 19B, $P_y < P_y' < 2 \times P_y$, and the droplet ejection pitch $P_y'$ in the y direction after the fine adjustment has been adjusted within the range less than the minimum droplet ejection pitch $P_y$ in the y direction. The jetting positions shown by the broken lines in FIG. 19B represent the jetting positions prior to fine adjustment shown in FIG. 19A.

The above-described fine adjustment of the droplet ejection pitches in the x direction and y direction is performed on the basis of data on the arrangement of liquid resist (coating distribution) and physical properties of the liquid such as volatilization ability. Thus, when liquid droplets are required more than the standard according to the jetting data of the liquid resist corresponding to the fine pattern to be formed on the substrate, then the droplet ejection pitch is changed to a smaller value and the liquid resist is applied with higher density. On the other hand, when liquid droplets are not required more than the standard, then the droplet ejection pitch is changed to a larger value and the liquid resist is applied more sparsely. The droplet amount of liquid resist may be changed in the above-described manner according to the changes in droplet ejection pitch. It is preferred that the fine adjustment of droplet ejection pitches in the x direction and y direction be performed based on the jetting positions that take into account the anisotropy of wet-spreading in the mold patterns explained with reference to FIG. 3 and FIG. 4.

(Explanation of Jetting Detection)

Figure 20A:
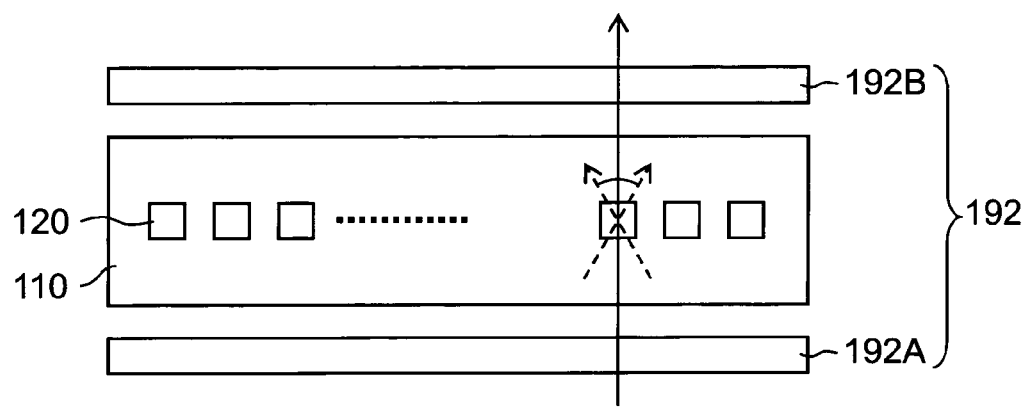
FIGS. 20A-20B illustrate discharge inspection used in the head shown in FIG. 7.
Figure 20B:
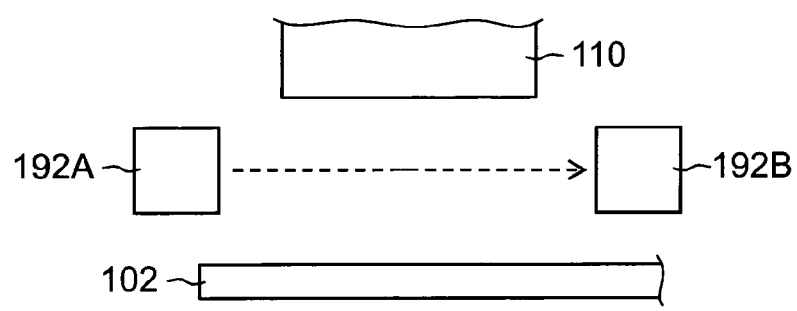

Jetting detection of the head 110 will be explained below. As shown in FIGS. 20A and 20B, the head 110 shown in the present example is provided with a sensor 192 for detecting a jetting state. FIG. 20A shows schematically the mutual arrangement relationship of the head 110 and the sensor 192. FIG. 20B is a view from the end portion, in the short side direction of the head 110, of the head 110 and the sensor 192 shown in FIG. 20A.

As shown in FIG. 20A, a light-emitting unit 192A is disposed on one side and a light-receiving unit 192B is disposed on the other side, in the short side direction of the head 110, of the head 110. The openings of the nozzles 120 provided in the head 110 have a substantially square planar shape, as viewed from the jetting surface of the head 110, and the observation direction of the sensor 192 (shown by the solid line arrow in the figure) forms an angle of almost 45° with diagonals (shown by broken line arrows in the figure) of the square.

With the nozzles each having the opening of a substantially square shape that are used in the present example, the apex angle becomes a singular point. Therefore, the flight of droplets curves in the diagonal direction. By observing the droplets in terms of the direction forming an angle of about 45° with respect to the direction in which the flight curving occurs (that is, the diagonal direction) and analyzing the obtained detection signals, it is possible to determine the flight speed, flight curving, and volume.

<Explanation of Nozzle Plate>
(Method for Manufacturing Nozzle Plate)

A method of manufacturing the nozzles 120 that have a substantially square planar shape of opening, as shown in FIG. 8 and the like, will be explained below. FIGS. 21A to 21H are explanatory drawings illustrating schematically steps of process for forming the nozzle plate 130 having the nozzles 120.

Figure 21A:
FIGS. 21A-21H illustrate an example of a nozzle manufacturing method for the head shown in FIG. 8.
Figure 21B:
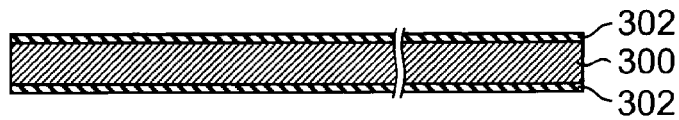

The nozzle plate 130 (see FIG. 9) used in the head 110 shown in the present example is formed by subjecting a single crystal silicon wafer to anisotropic etching. The P-type or N-type surface with the crystal orientation (100) of the silicon wafer 300 shown in FIG. 21A is polished. As shown in FIG. 21B, the surfaces of the silicon wafer 300 is oxidized at a treatment temperature of 1000° C. and an oxide film ($SiO_2$) 302 with a thickness of 4500 Å is formed.

Figure 21C:
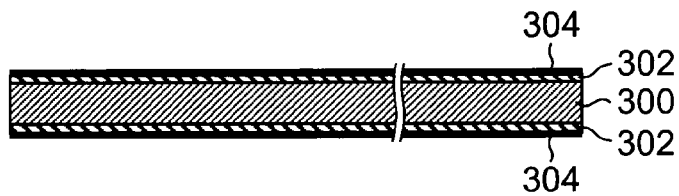
Figure 21D:
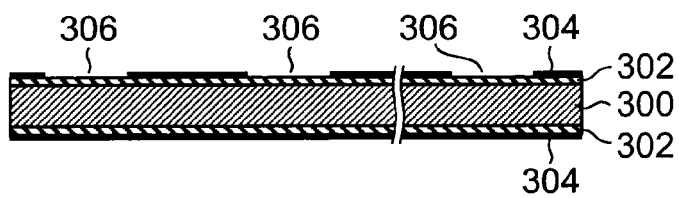
Figure 21E:
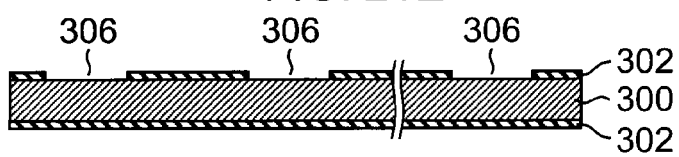
Figure 21F:
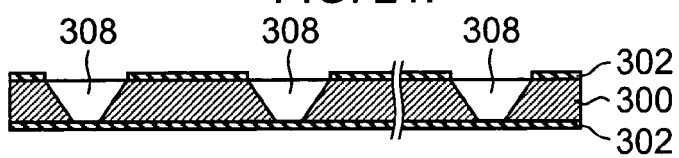
Figure 21G:
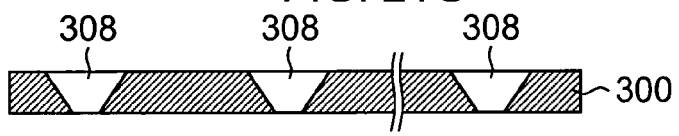

Then, as shown in FIG. 21C, a resist layer 304 is formed on the oxide film 302, and an opening pattern 306 is exposed and developed in the resist layer 304 (FIG. 21D). Then, the oxide film 302 of the opening pattern 306 is removed and the resist layer 304 is also removed (FIG. 21E). The silicon wafer 300 from which the resist layer 304 and the oxide film 302 of the opening pattern 306 have been removed is immersed in an etching solution at a temperature of 100° C. to 120° C., and holes 308 having a shape (a substantially triangular cross-sectional shape) with an opening surface decreasing from one surface toward the other surface are formed (FIG. 21F).

Figure 21H:
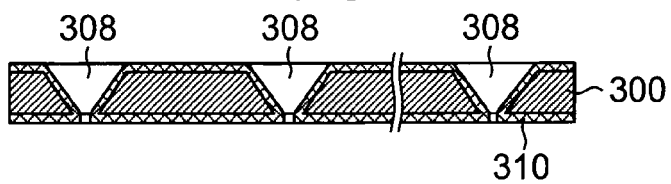

After the oxide film 302 is then removed (FIG. 21G), oxidation is performed, and an oxide film 310 is formed inside the holes 308 and also on the surface of the silicon wafer 300 (FIG. 21H).

Figure 22A:
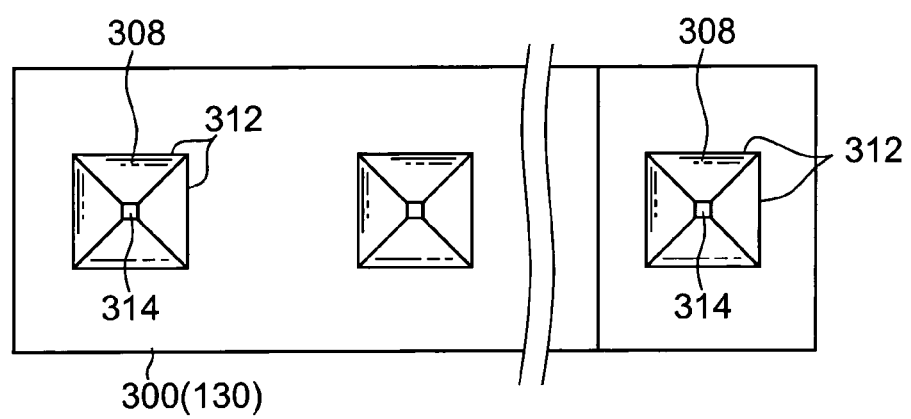
FIGS. 22A-22B are enlarged perspective views of a nozzle manufactured by a manufacturing method.
Figure 22B:
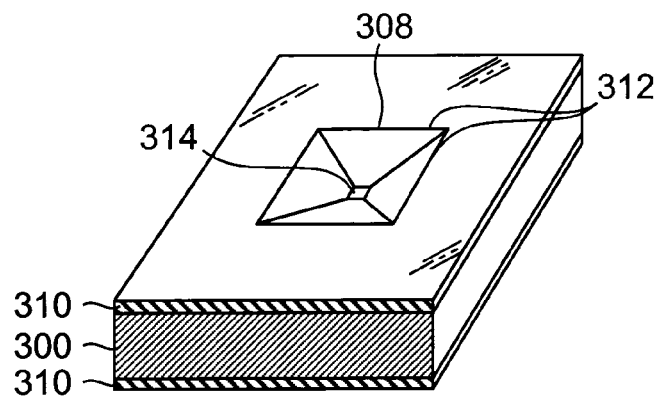

FIG. 22A is a plan view, as viewed from the inside, of nozzles 120 (see FIG. 8) formed by using the above-described manufacturing method. FIG. 22B is a partially enlarged view (perspective view) of the configuration shown in FIG. 22A. As shown in FIG. 22A, the openings 312, 314 of the holes 308 that will serve as nozzles 120 have a substantially square shape. The opening 314 becomes the opening of the nozzle 120 when the plate is attached to the head 110. As shown in FIGS. 22A and 22B, the hole 308 that will serve as the nozzle 120 has the shape of a truncated substantially quadrangular pyramid.

The nozzle plate 130 manufactured by using such a manufacturing method has the desirable nozzles 120 having no spread in size or shape.

(Explanation of Liquid Repelling Treatment (Liquid-Repelling Film))

The liquid repelling treatment (liquid-repelling film) of the nozzle plate will be explained below. The droplet discharge surface of the nozzle plate 130 (see FIG. 8) is subjected to a liquid repelling treatment providing for predetermined performance necessary to ensure stability of discharge.

FIG. 23 shows test data illustrating the difference in discharge characteristics caused by characteristics of the liquid-repelling film formed on the nozzle plate 130. In the evaluation test performed to obtain these data, the liquid-repelling film formed on a predetermined inkjet head was forcibly deteriorated by oxygen plasma in such a manner the contact angle of the liquid-repelling film was changed, and the discharge state was observed. The contact angle was measured by a tangent method and an expansion-contraction method by using a contact angle meter FTA 1000 (manufactured by FTA).

In FIG. 23, the "STATIC" column shows values of a static contact angle which were determined by a tangent method. Thus, a resist composition was dropwise applied to the nozzle plate 130, the contour shape of the droplet image on the nozzle plate 130 was assumed as part of a circle, the circle center was determined, and the angle formed between a straight line and a tangent to the circle was taken as a static contact angle. The "FORWARD" column shows values of a forward contact angle (advancing contact angle), and the "REARWARD" column shows values of a rearward contact angle (receding contact angle). These values of contact angle were determined by the expansion-contraction method. When a droplet that came into contact with a solid surface was caused to bulge, a contact angle obtained when the contact angle had stabilized was taken as the forward contact angle, and when a droplet that came into contact with a solid surface was caused to shrink by suction, a contact angle obtained when the contact angle had stabilized was taken as the rearward contact angle.

As shown in FIG. 23, under CONDITIONS 1 and 2, a good jetting state was observed at a droplet jetting frequency of 10 kHz and the nozzle surface (discharge surface) was in a dry state. By contrast, under CONDITIONS 3 and 4, the droplet flight curving occurred at a jetting frequency of 5 kHz and 10 kHz and the entire nozzle surface was wetted by the droplets (liquid).

A fluororesin can be used to obtain the liquid-repelling film. Various well-known fluororesins such as fluorocarbon resins that include "—$CF_2$—" in a main chain and have a "—$CF_3$" end group, fluorosilicone resins that include "—$SiF_2$—" in a main chain and have a "—$SiF_3$" end group, and hydrofluorocarbon resins and hydrofluorosilicone resins obtained by substituting some of fluorine atoms in these fluorocarbon resins and fluorosilicone resins with a hydrogen atom can be used as the fluororesin materials.

More specifically, fluororesins such as PTFE (polytetrafluoroethylene), PFA (tetrafluoroethylene-perfluoroalkyl vinyl ether copolymer), FEP (tetrafluoroethylene-hexafluoropropylene copolymer) and ETFE (tetrafluoroethylene copolymer) can be used, for example. Among them, PTFE can be presented as a preferred example.

A precursor substance molecule having a carbon chain terminated with a "—$CF_3$" group at one end and a "—$SiCl_3$" group at the second end can be used as the liquid-repelling film. Examples of suitable precursor substances that adhere to a silicon surface include tridecafluoro-1,1,2,2-tetrahydrooctyltrichlorosilane (FOTS) and 1H,1H,2H,2H-perfluorodecyltrichlorosilane (FDTS).

Where the liquid-repelling film deteriorates, the discharge characteristic changes as shown in FIG. 23. Therefore, a means (device) for determining periodically the state of the liquid-repelling film can be provided and mask processing can be performed with software so as to prevent the use of a nozzle group including a nozzle for which liquid-repelling film deterioration has been observed.

With the nanoimprint system 100 configured in the above-described manner, the nozzles 120 provided in the head 110 are grouped and jetting control is performed for each group. Therefore, individual differences between the groups (variation in discharge characteristics between the nozzles and variation between piezoelectric elements) can be controlled and unevenness in the remaining film thickness (residue) caused by the individual differences is avoided. Therefore, the thickness of the film formed by the jetted droplets is stabilized and therefore, the conditions of the substrate etching process are stabilized, and an advantageous fine pattern is formed on the substrate.

In the configuration in which the resist droplets are disposed discretely in the x direction that is substantially parallel to the nozzle arrangement direction and in the y direction that is substantially perpendicular to the nozzle arrangement direction, the droplet ejection pitch in either of the x direction and y direction, or in both the x direction and the y direction can be finely adjusted within a range below the minimum droplet ejection pitch. Therefore, the ejected droplet density of the droplets can be accurately changed in a simple manner according to the jetting pattern and physical properties of the liquid such as volatilization ability.

Further, the counter 194 that counts the number of droplet ejection events for each group is provided, the number of droplet ejection events is measured for each group, and a group for performing jetting is selected according to the measurement results. Therefore, the jetting frequency of a specific group is prevented form increasing and durability of the head 110 is increased.

In addition, the sensor 192 for detecting the jetting state is provided and droplet flight curving or abnormal droplet amount can be determined on the basis of the detection results. Therefore, a group can be selected according to the abnormality of the jetting state and the head discharge characteristics are stabilized.

Further, in the present example, the nanoimprint system is considered in which a fine pattern is formed by the resist liquid on the substrate, but the above-described configuration can be also implemented as an integral device (nanoimprint device). Further, it is also possible to configure a liquid application device in which a solution is discretely disposed on a substrate by an inkjet method.

<Application Example>

An application example of the present invention will be described below. In the above-described embodiment, an example is explained in which a nanoimprint method is used for forming a fine pattern on a substrate, but a quartz mold can be formed by using such a nanoimprint method.

(Fabrication of Quartz Mold)

A quartz mold can be fabricated by using a method for forming a fine pattern on a quartz substrate illustrated by FIGS. 1A to 1F. Thus, a quartz mold can be fabricated by using the nanoimprint system and method according to the above-described embodiment. A Si mold illustrating hereinbelow the fabrication method can be desirably used when fabricating the quartz mold.

(Fabrication of Si Mold)

Figure 24A:
FIGS. 24A-24E illustrates a process for manufacturing a silicon mold (template master).
Figure 24B:
Figure 24C:
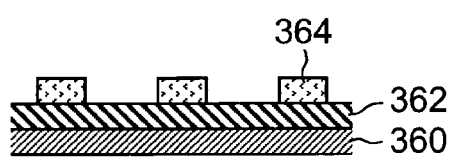

A Si mold used in the above-described embodiment can be manufactured by the procedure illustrated by FIGS. 24A to 24E. First, a silicon oxide film 362 is formed on a Si base member 360 shown in FIG. 24A. Then, as shown in FIG. 24B, a liquid photoresist such as a novolac resin and an acrylic resin is applied by a spin coating method or the like, so that a photoresist layer 364 is formed. Then, as shown in FIG. 24C, the Si base member 360 is irradiated with a laser beam (or electron beam), and a predetermined pattern is exposed on the surface of the photoresist 364.

Figure 24D:

Then, as shown in FIG. 24D, the photoresist layer 364 is developed, the exposed portion is removed, and selective etching is performed by RIE or the like by using the pattern of the photoresist layer after the removal as a mask, so that a Si mold having a predetermined pattern is obtained.

Figure 24E:
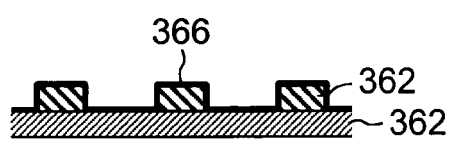

A mold subjected to a peel-off (release) treatment to improve separation ability of the photocurable resin and the mold surface may be also used as the mold for use in the nanoimprint method in accordance with an embodiment of the present invention. Such a mold can be obtained by treatment with a silane coupling agent such as a silicon-containing or fluorine-containing silane coupling agent. Commercial release agents such as Optool DSX manufactured by Daikin Industries Ltd. and Novec EGC-1720 manufactured by Sumitomo 3M Co., Ltd. can be also desirably used. A Si mold having a parting layer 366 formed thereon is shown in FIG. 24E.

<Explanation of Photocurable Liquid Resin>

A resist composition (referred to hereinbelow simply as "resist") will be explained below in greater detail, as an example of a photocurable liquid resin for use in the nanoimprint system shown in the present example.

The resist composition is a curable composition for imprinting that includes at least a surfactant of at least one type of fluorine (fluorine-containing surfactant), a polymerizable compound, and a photopolymerization initiator I.

The resist composition may include a monofunctional monomer component or a monomer component with higher functionality that has a polymerizable functional group with the object of developing crosslinking ability attained due to the presence of polyfunctional polymerizable groups, increasing the carbon density, increasing the total bonding energy, or increasing etching resistance by suppressing the content ratio of sites with a high electronegativity, such as O, S, and N, contained in the resin after curing. Further, if necessary, a coupling agent for improving coupling to the substrate, a volatile solvent, and an antioxidant, and the like, can be also contained in the resist composition.

A material similar to the above-described adhesion treatment agent for the substrate can be used as the coupling agent for improving coupling to the substrate. As for the content thereof, the coupling agent may be contained at a level ensuring the presence thereof at the interface between the substrate and the resist layer. The content ratio of the coupling agent may be preferably equal to or less than 10 percent by mass, preferably equal to or less than 5 percent by mass, more preferably equal to or less than 2 percent by mass, and even most preferably equal to or less than 0.5 percent by mass.

From the standpoint of inclusion of a solid fraction (component remaining after the volatile solvent component has been removed) contained in the resist composition into the pattern formed on the mold 112 (see FIGS. 6A-6C) and wetting and spreading ability on the mold 112, it is preferred that the viscosity of the resist composition be equal to or less than 1000 mPa·s, more preferably equal to or less than 100 mPa·s, and even more preferably equal to or less than 20 mPa·s, as represented by the viscosity of the solid component. However, when an inkjet system is used, where jetting is performed at room temperature or the temperature can be controlled by the head during discharging, it is preferred that the viscosity be equal to or less than 20 mPa·s in this temperature range. The surface tension of the resist composition is preferably within a range of not less than 20 mN/m and not greater than 40 mN/m, more preferably not less than 24 mN/m and not greater than 36 mN/m from the viewpoint that the discharge stability in ink jetting is ensured.

(Polymerizable Compound)

A polymerizable compound in which the fluorine content ratio represented by Math. 1 below is equal to or less than 5% or which contains substantially no fluoroalkyl groups or fluoroalkyl ether groups is taken as the polymerizable compound serving as the main component of the resist composition.

$$\text{Fluorine Content Ratio} = \{[(\text{Number of Fluorine Atoms in Polymerizable Compound}) \times (\text{Atomic Weight of Fluorine Atoms})]/(\text{Molecular Weight of Polymerizable Compound})\} \times 100 \quad \text{[Math. 1]}$$

The preferred polymerizable compound has high accuracy of pattern after curing and good quality such as etching endurance. Such polymerizable compound preferably includes a polyfunctional monomer that forms a polymer with a three-dimensional structure when crosslinked by polymerization. The polyfunctional monomer preferably includes at least one divalent or trivalent aromatic group.

In the case of a resist having a three-dimensional structure after curing (polymerization), good shape retention ability after curing is obtained, stresses applied to the resist are concentrated in a specific area of the resist structural body due to adhesion between the mold and the resist during mold separation, and plastic deformation of the pattern is inhibited. However, where the ratio of the polyfunctional monomer that becomes a polymer having a three-dimensional structure after polymerization or the density of sites forming three-dimensional crosslinking after polymerization increases, the Young's modulus after curing increases and the deformation ability decreases, and film brittleness increases. Therefore, the film may be easily fractured during mold separation. In particular, with the pattern having a pattern size of equal to or less than 30 nm (width) and a pattern aspect ratio of equal to or greater than 2 where the residual film thickness is equal to or less than 10 nm, the probability of pattern peeling off or tearing off is expected to increase when the pattern is formed in a wide area, as in the case of hard disk patterns or semiconductor patterns.

Therefore, the content ratio of the polyfunctional monomer in the polymerizable compound is preferably equal to or higher than 10 percent by mass, more preferably equal to or higher than 20 percent by mass, even more preferably equal to or higher than 30 percent by mass, and most preferably equal to or higher than 40 percent by mass.

Further, it was found that the crosslinking density represented by the following equation [Math. 2] is preferably not less than $0.01/\text{nm}^2$ and not greater than $10/\text{nm}^2$, more preferably not less than $0.1/\text{nm}^2$ and not greater than $6/\text{nm}^2$, even more preferably not less than $0.5/\text{nm}^2$ and not greater than $5.0/\text{nm}^2$. The crosslinking density of the composition is found by determining the crosslinking density of each molecule and then finding the weight-average value, or by measuring the density of composition after curing, and using the weight-averaged values of Mw and (Nf−1) and the following equation $$Da = \frac{Na \times Dc}{Mw} \times (Nf - 1) \quad \text{[Math. 2]}$$

Da: crosslinking density of one molecule.
Dc: density after curing.
Nf: the number of acrylate functional groups contained in one molecule of the monomer.
Na: Avogadro constant.
Mw: molecular weight.

In this equation, Da is a crosslinking density of one molecule, Dc is a density after curing, Nf is the number of acrylate functional groups contained in one molecule of the monomer, Na is the Avogadro constant, and Mw is a molecular weight.

The polymerizable functional groups of the polymerizable compound are not particularly limited, but from the standpoint of reactivity and stability, a methacrylate group and an acrylate group are preferred, and an acrylate group is especially preferred.

Dry etching resistance can be estimated by an Ohnishi parameter and a ring parameter of the resist composition. Excellent dry etching ability is obtained when the Ohnishi parameter is small and the ring parameter is large. According to the present invention, in the resist composition the Ohnishi parameter is equal to or less than 4.0, preferably equal to or less than 3.5, and more preferably equal to or less than 3.0, and the ring parameter is equal to or greater than 0.1, preferably equal to or greater than 0.2, and more preferably equal to or greater than 0.3.

The above-mentioned parameters are determined by calculating material parameter values, by using the below-described computational formulas on the basis of structural formulas, with respect to constituent substances, other than the volatile solvent component, constituting the resist composition and averaging the calculated material parameter values for the entire composition on the basis of compounding weight ratios. Therefore, with respect to the polymerizable compound, which is the main component of the resist composition, the selection is preferably made with consideration for the abovementioned parameters and other components contained in the resist composition.

Ohnishi parameter=(total number of atoms in composition)/{(number of carbon atoms in composition)−(number of oxygen atoms in composition)}.

Ring parameter=(carbon mass forming a ring structure)/(total mass of compound).

The below-describes polymerizable monomers and oligomers obtained by polymerization of several units of the polymerizable monomers are examples of the polymerizable compounds. From the standpoint of pattern formation ability and etching resistance, it is preferred that at least one compound from among the polymerizable monomer (Ax) and the compounds described in paragraphs 0032 to 0053 of the description of Patent Literature 3 (PTL 3) be included.

(Polymerizable Monomer (Ax))

The polymerizable monomer (Ax) is represented by the General Formula (I) in [Chem. 1] below.

[Chem. 1]

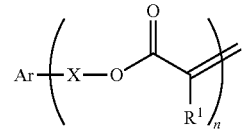

General Formula (I)

In the General Formula (I) in [Chem. 1] above, Ar represents an optionally substituted divalent or trivalent aromatic group, X represents a single bond or an organic linking group, $R^1$ represents a hydrogen atom or an optionally substituted alkyl group, and n is 2 or 3.

In the General Formula (I) above, when n=2, Ar is a divalent aromatic group (that is, an arylene group), and when n=3, Ar is a trivalent aromatic group. Examples of the arylene group include hydrocarbon arylene groups such as a phenylene group and a naphthylene group, and heteroarylene groups for which indole, carbazole, or the like is a linking group. Hydrocarbon arylene groups are preferred. From the standpoint of viscosity and etching resistance, a phenylene group is even more preferred. The arylene group may have a substituent. Examples of preferred substituents include an alkyl group, an alkoxy group, a hydroxyl group, a cyano group, an alkoxycarbonyl group, an amido group, and a sulfonamido group.

Examples of the organic linking group represented by X include an alkylene group, an arylene group, and an aralkylene group that may contain a hetero atom in the chain. Among them, an alkylene group and an oxyalkylene group are preferred and an alkylene group is even more preferred. It is especially preferred that a single bond or an alkylene group be used as X.

$R^1$ is preferably a hydrogen atom or a methyl group, and more preferably a hydrogen atom. When $R^1$ has a substituent, the preferred substituent is not particularly limited. For example, a hydroxyl group, a halogen atom (except for fluorine), an alkoxy group, and an acyloxy group can be used. n is 2 or 3, preferably 2.

From the standpoint of decreasing the composition viscosity, it is preferred that the polymerizable monomer (Ax) be the polymerizable monomer represented by the General Formula (I-a) or General Formula (I-b) shown in [Chem. 2] below.

[Chem. 2]

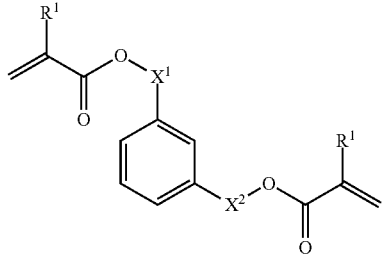

General Formula (I-a)

General Formula (I-b)

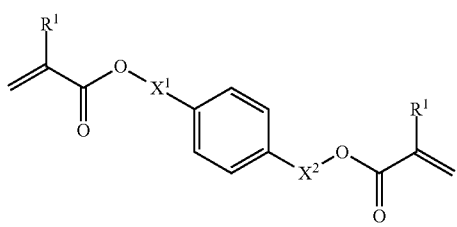

In the General Formulas (I-a) and (I-b) above, $X^1$, $X^2$ represent, independently from each other, alkylene groups that may have a substituent having 1 to 3 carbon atoms, and $R^1$ is a hydrogen atom or an optically substituted alkyl group.

In the General Formula (I-a), the aforementioned $X^1$ is preferably a single bond or a methylene group, and from the standpoint of reducing the viscosity, a methylene group is preferred. The preferred range of $X^2$ is similar to the preferred range of $X^1$.

$R^1$ herein has the same meaning as $R^1$ in the General Formula (I) above and the same preferred range. Where the polymerizable monomer (Ax) is a liquid at a temperature of 25° C., the generation of foreign matter can be advantageously inhibited even when the added amount of the monomer is increased. From the standpoint of pattern formation ability, it is preferred that the viscosity of the polymerizable monomer (Ax) at a temperature of 25° C. be less than 70 mPa·s, more preferably equal to or less than 50 mPa·s, and even more preferably equal to or less than 30 mPa·s.

Specific examples of the preferred polymerizable monomers (Ax) are shown in [Chem. 3] below. $R^1$ herein has the same meaning as $R^1$ in the General Formula (I). From the standpoint of curability, a hydrogen atom is preferred as $R^1$.

[Chem. 3]

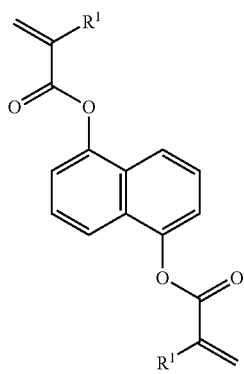

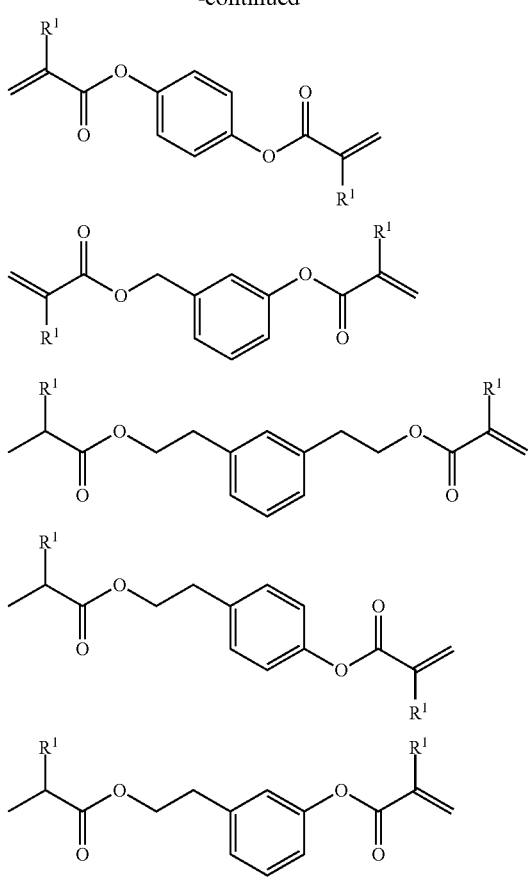

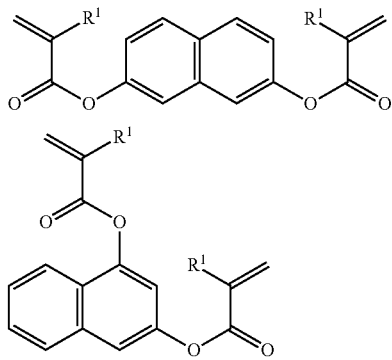

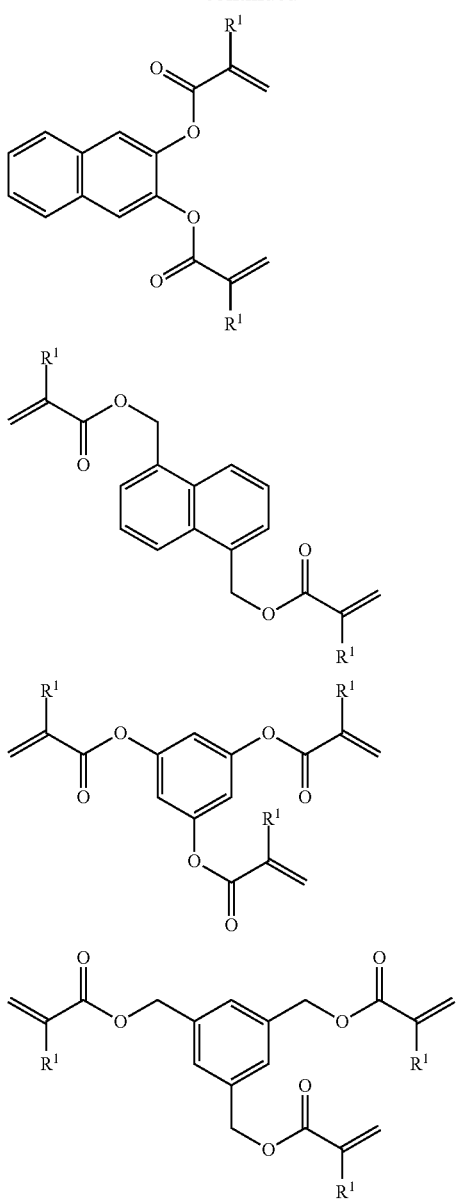

Among these compounds, the compounds shown in [Chem. 4] below are especially preferred because they are liquids at a temperature of 25° C., and low viscosity and good curability can be attained.

[Chem. 4]

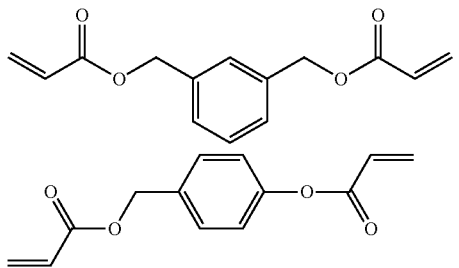

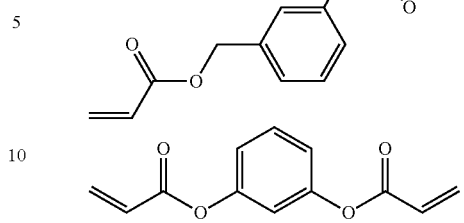

To the resist composition, from the standpoint of composition viscosity, dry etching resistance, imprint suitability, and curability, it is preferred that the polymerizable monomer (Ax) be used, as necessary, together with a below-described another polymerizable monomer that is different from the polymerizable monomer (Ax).

(Other Polymerizable Monomers)

For example, polymerizable unsaturated monomers having 1 to 6 ethylenic unsaturated bond-containing groups; compounds (epoxy compounds) having an oxirane ring; vinyl ether compounds; styrene derivatives; compounds having a fluorine atom, and propenyl ethers or butenyl ethers can be used as the other polymerizable monomers. From the standpoint of curability, polymerizable unsaturated monomers having 1 to 6 ethylenic unsaturated bond-containing groups are preferred.

Among these other polymerizable monomers, from the standpoint of imprint suitability, dry etching resistance, curability, and viscosity, it is preferred that compounds be included that are described in paragraphs 0032 to 0053 of the description of Patent Literature 3. The aforementioned polymerizable unsaturated monomers having 1 to 6 ethylenic unsaturated bond-containing groups (mono- to hexafunctional polymerizable unsaturated monomers) that can be additionally included will be explained below.

Specific examples of polymerizable unsaturated monomers having one ethylenic unsaturated bond-containing group (mono functional polymerizable unsaturated monomer) include 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl(meth)acrylate, 2-ethylhexylcarbitol(meth)acrylate, 2-hydroxybutyl(meth)acrylate, 2-hydroxyethyl(meth)acrylate, 2-hydroxypropyl (meth)acrylate, 2-methoxyethyl(meth)acrylate, 3-methoxybutyl(meth)acrylate, 4-hydroxybutyl(meth)acrylate, acrylic acid dimer, benzyl(meth)acrylate, 1- or 2-naphthyl(meth) acrylate, butanediol mono(meth)acrylate, butoxyethyl(meth) acrylate, butyl(meth)acrylate, cetyl(meth)acrylate, ethylene oxide-modified (referred to hereinbelow as "EO") cresol (meth)acrylate, dipropylene glycol(meth)acrylate, ethoxyphenyl(meth)acrylate, ethyl(meth)acrylate, isoamyl(meth) acrylate, isobutyl(meth)acrylate, isooctyl(meth)acrylate, cyclohexyl(meth)acrylate, isobornyl(meth)acrylate, dicycloheptanyl(meth)acrylate, dicyclopentanyl oxyethyl(meth) acrylate, isomyristyl(meth)acrylate, lauryl(meth)acrylate, methoxydipropylene glycol(meth)acrylate, methoxytripropylene glycol(meth)acrylate, methoxypolyethylene glycol (meth)acrylate, methoxytriethylene glycol(meth)acrylate, methyl(meth)acrylate, neopentyl glycol benzoate(meth) acrylate, nonylphenoxypolyethylene glycol(meth)acrylate, nonylphenoxypolypropylene glycol(meth)acrylate, octyl (meth)acrylate, paracumylphenoxyethylene glycol(meth)

acrylate, epichlorohydrin (referred to hereinbelow as "ECH")-modified phenoxyacrylate, phenoxyethyl(meth)acrylate, phenoxydiethylene glycol(meth)acrylate, phenoxyhexaethylene glycol(meth)acrylate, phenoxytetraethylene glycol(meth)acrylate, polyethylene glycol(meth)acrylate, polyethylene glycol-polypropylene glycol(meth)acrylate, polypropylene glycol(meth)acrylate, stearyl(meth)acrylate, EO-modified succinic acid (meth)acrylate, tert-butyl(meth)acrylate, tribromophenyl(meth)acrylate, EO-modified tribromophenyl(meth)acrylate, tridodecyl(meth)acrylate, p-isopropenyl phenol, styrene, α-methylstyrene, and acrylonitrile.

Among these compounds, monofunctional (meth)acrylates having an aromatic structure and/or alicyclic hydrocarbon structure are preferred because they improve resistance to dry etching. Specific examples of preferred compounds include benzyl(meth)acrylate, dicyclopentanyl(meth)acrylate, dicyclopentanyl oxyethyl(meth)acrylate, isobornyl (meth)acrylate, and adamantyl(meth)acrylate, and benzyl (meth)acrylate is especially preferred.

It is also preferred that a polyfunctional polymerizable unsaturated monomer having two ethylenic unsaturated bond-containing groups be used as the other polymerizable monomer. Examples of difunctional polymerizable unsaturated monomer having two ethylenic unsaturated bond-containing groups that can be advantageously used include diethylene glycol monoethyl ether(meth)acrylate, dimethylol dicyclopentane di(meth)acrylate, di(meth)acrylated iscyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, aryloxypolyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propylene oxide (referred to hereinbelow as "PO")-modified neopentyl glycol diacrylate, caprolactone-modified hydroxypivalic acid ester neopentyl glycol, stearic acid-modified pentaerythritol di(meth)acrylate, ECH-modified phthalic acid di(meth)acrylate, poly(ethylene glycol-tetramethylene glycol)di(meth)acrylate, poly(propylene glycol-tetramethylene glycol)di(meth)acrylate, polyester (di) acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecane di(meth)acrylate, neopentyl glycol-modified trimethylol propane di(meth)acrylate, tripropylene glycol di(meth)acrylate, EO-modified tripropylene glycol di(meth)acrylate, triglycerol di(meth)acrylate, dipropylene glycol di(meth)acrylate, divinyl ethylene urea, and divinyl propylene urea.

Among these compounds, neopentyl glycol(meth)acrylate, 1,9-nonanediol di(meth)acrylate, tripropylene glycol di(meth)acrylate, tetraethylene glycol di(meth)acrylate, hydroxypivalic acid neopentyl glycol di(meth)acrylate, and polyethylene glycol di(meth)acrylate can be particularly desirably used in the present invention.

Specific examples of polyfunctional polymerizable unsaturated monomers having three or more ethylenic unsaturated bond-containing groups include ECH-modified glycerol tri (meth)acrylate, EO-modified glycerol tri(meth)acrylate, PO-modified glycerol tri(meth)acrylate, pentaerythritol triacrylate, EO-modified phosphoric acid triacrylate, trimethylol propane tri(meth)acrylate, caprolactone-modified trimethylol propane tri(meth)acrylate, EO-modified trimethylol propane tri(meth)acrylate, PO-modified trimethylol propane tri (meth)acrylate, tris(acryloxyethyl)isocyanurate, dipentaerythritol hexa(meth)acrylate, caprolactone-modified dipentaerythritol hexa(meth)acrylate, dipentaerythritol hydroxypenta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxytetra(meth)acrylate, and pentaerythritol tetra(meth)acrylate.

Among these compounds, EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri (meth)acrylate, dipentaerythritol hexa(meth)acrylate, pentaerythritol ethoxytetra(meth)acrylate, and pentaerythritol tetra(meth)acrylate can be particularly advantageously used in the present invention.

For example, polyglycidyl esters of polybasic acids, polyglycidyl ethers of polyhydric alcohols, polyglycidyl ethers of polyoxyalkyleneglycols, polyglycidyl ethers of aromatic polyols, hydrogenated compounds of polyglycidyl ethers of aromatic polyols, urethane polyepoxy compounds, and epoxidized polybutadienes can be used as compounds (epoxy compounds) having an oxirane ring. These compounds can be used individually or in mixtures of two or more thereof.

Specific examples of the compounds (epoxy compounds) having an oxirane ring include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether; polyglycidyl ethers of polyether polyols obtained by adding at least one alkylene oxide to an aliphatic polyhydric alcohol such as ethylene glycol, propylene glycol, and glycerin; diglycidyl esters of aliphatic long-chain dibasic acids; monoglycidyl ethers of aliphatic higher alcohols; monoglycidyl ethers of polyether alcohols obtained by adding an alkylene oxide to phenol, cresol, butyl phenol, or mixtures thereof, and glycidyl esters of higher fatty acids.

Among these compounds, bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, and polypropylene glycol diglycidyl ether are preferred.

Examples of commercial products that can be advantageously used as the glycidyl group-containing compound include UVR-6216 (manufactured by Union Carbide Corp.), Glycidol, AOEX24, Cyclomer A200 (all of the above are manufactured by Daicel Chemical Industries, Ltd.), Epicoat 828, Epicoat 812, Epicoat 1031, Epicoat 872, Epicoat CT508 (all of the above are manufactured by Yuka Shell Co., Ltd.), KRM-2400, KRM-2410, KRM-2408, KRM-2490, KRM-2720, and KRM-2750 (all of the above are manufactured by Asahi Denka Kogyo K.K.). These compounds can be used individually or in combinations of two or more thereof.

There are no restrictions on the method of fabricating these compounds containing an oxirane ring, and they can be synthesized with reference, for example, to Patent Literatures 4-6 (PTLs 4-6).

Vinyl ether compounds may be also used as the other polymerizable monomer used in accordance with the present invention. Well-known vinyl ether compounds can be selected as appropriate. Examples of such compounds include 2-ethylhexyl vinyl ether, butanediol-1,4-divinyl ether, diethylene glycol monovinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, bisphenol A divinyloxyethyl ether.

These vinyl ether compounds can be synthesized, for example, by a reaction of a polyhydric alcohol or a polyhydric phenol with acetylene, or by a reaction of a polyhydric alcohol or a polyhydric phenol and a halogenated alkyl vinyl ether. These compounds can be used individually or in combinations of two or more thereof.

Styrene derivatives also can be used as the other polymerizable monomer. Examples of styrene derivatives include styrene, p-methylstyrene, p-methoxystyrene, β-methylstyrene, p-methyl-β-methylstyrene, α-methylstyrene, p-methoxy-β-methylstyrene, and p-hydroxystyrene.

A compound having a fluorine atom, such as trifluoroethyl (meth)acrylate, pentarfluoroethyl(meth)acrylate, (perfluorobutyl)ethyl(meth)acrylate, perfluorobutyl-hydroxypropyl (meth)acrylate, (perfluorohexyl)ethyl(meth)acrylate, octafluoropentyl(meth)acrylate, perfluorooctyl ethyl(meth) acrylate, and tetrafluoropropyl(meth)acrylate can be also used with the object of improving coatability and ability to separate from the mold.

A propenyl ether and a butenyl ether can be also used as the other polymerizable monomer. Examples of the propenyl ether and butenyl ether include 1-dodecyl-propenyl ether, 1-dodecyl-1-butenyl ether, 1-butenoxymethyl-2-norbornene, 1-4-di(1-butenoxy)butane, 1,10-di(1-butenoxy)decane, 1,4-di(1-butenoxymethyl)cyclohexane, diethylene glycol di(1-butenyl)ether, 1,2,3-tri(1-butenoxy)propane, and propenyl ether propylene carbonate.

(Fluorine-Containing Surfactant)

In the imprint system shown in the present example, the fluorine-containing surfactant becomes part of the resist pattern. Therefore, it is preferred that the fluorine-containing surfactant have good resist characteristics such as good pattern forming ability, mold separation ability after curing, and etching resistance.

The content ratio of the fluorine-containing surfactant in the resist composition is for example not less than 0.001 percent by mass and not greater than 5 percent by mass, preferably not less than 0.002 percent by mass and not greater than 4 percent by mass and more preferably not less than 0.005 percent by mass and not greater than 3 percent by mass.

When two or more surfactants are used, the total amount is within the aforementioned range. Where the content ratio of the surfactant in the composition is not less than 0.001 percent by mass and not greater than 5 percent by mass, good coating uniformity is obtained and deterioration of mold transfer characteristic caused by excessive amount of surfactant or deterioration of etching adaptability in the etching step after imprinting are unlikely to be encountered.

(Polymerization Initiator I)

The polymerization initiator I is not particularly limited and may be any compound that is activated by light L1 used when curing the resist composition and generates active species that initiate polymerization of the polymerizable compound contained in the resist composition. Radical polymerization initiators are preferred as the polymerization initiator I. In the present invention, a plurality of polymerization initiators I may be used together.

From the standpoint of curing sensitivity and absorption characteristic, acylphosphine oxide compounds and oxime ester compounds are preferred as the polymerization initiator I. For example, the compounds described in paragraph 0091 of the description of Patent Literature 7 (PTL 7) can be advantageously used.

The content of the polymerization initiator I in the entire composition, without the solvent, is for example not less than 0.01 percent by mass and not greater than 15 percent by mass, preferably not less than 0.1 percent by mass and not greater than 12 percent by mass, more preferably not less than 0.2 percent by mass and not greater than 7 percent by mass. When photopolymerization initiators of two or more kinds are used the sum total content thereof is within the aforementioned range.

The content of photopolymerization initiator is preferably equal to or higher than 0.01 percent by mass because sensitivity (rapid curability), resolution, line edge roughness ability, and coating film strength tend to improve. On the other hand, the content of photopolymerization initiator is preferably equal to or less than 15 percent by mass because light transmissivity, coloration ability and handleability tend to improve.

The preferred amounts of photopolymerization initiators added to inkjet compositions including a dye and/or a pigment or compositions for liquid crystal display color filters have been heretofore comprehensively studied, but data on the preferred amounts of photopolymerization initiators added to curable compositions for photoimprinting, such as those for imprinting, have not been published. Thus, in the systems including a dye and/or a pigment, an initiator sometimes acts as a radical trapping agent and affects photopolymerization ability and sensitivity. In these applications, the amount of the photopolymerization initiators added is optimized with consideration for this effect. By contrast, in resist compositions, dyes and/or pigments are not the mandatory components, and the optimum range of photopolymerization initiator can be different from that in the field of inkjet compositions or compositions for liquid crystal display color filters.

From the standpoint of curing sensitivity and absorption characteristic, acylphosphine oxide compounds and oxime ester compounds are preferred as the radical photopolymerization initiator included in the resist used in the imprint system shown in the present example. For example, commercial initiators can be used as the radical photopolymerization initiator used in accordance with the present invention. For example, radical photopolymerization initiator described in paragraph 0091 of the description of Patent Literature 7 can be desirably used.

The light L1 includes light with a wavelength within range such as UV, near UV, far IR, visible, and IR and also includes radiation in addition to electromagnetic waves. The radiation is in the form of, for example, microwaves, electron beam, EUV, and X rays. Further, laser beams of a 248 nm excimer laser, 193 nm excimer laser, and 172 nm excimer laser can be used. The light may be monochromatic light (single-wavelength light) that has passed through an optical filter or light (composite light) including different wavelengths. Multiple exposure light can be used, and with the object of increasing the film strength and etching resistance, the full-surface exposure can be performed after the pattern has been formed.

The photopolymerization initiator I should be selected as appropriate with respect to the wavelength of the light source used, and it is preferred that the selected photopolymerization initiator generate no gas during mold pressing and exposure. Where gas is generated, the mold is contaminated and therefore the mold should be cleaned more frequently. Another problem is that the resist composition undergoes deformation inside the mold and degrades the accuracy of the transferred pattern.

It is preferred that the polymerizable monomer contained in the resist composition be a radical polymerizable monomer, and that the photopolymerization initiator I be a radical polymerization initiator generating radicals under light irradiation.

(Other Components)

As has already been mentioned hereinabove, in addition to the above-described polymerizable compound, fluorine-containing surfactant, and photopolymerizable initiator I, the resist composition used in the imprint system shown in the present example may also include other components such as a surfactant, an antioxidant, a solvent, and a polymer component, within ranges in which the effect of the present invention is not lost, in order to attain the variety of objects. These other components are described in general terms below.

(Antioxidant)

The resist composition can include a conventional antioxidant. The content of the antioxidant is for example, not less than 0.01 percent by mass and not greater than 10 percent by mass, preferably not less than 0.2 percent by mass and not greater than 5 percent by mass, on the basis of the polymerizable monomer. When two or more antioxidants are used together, the sum total of the amounts thereof is within the abovementioned range.

The antioxidant inhibits discoloration caused by heat or light irradiation and also discoloration caused by various oxidizing gases such as active oxygen, $NO_x$, and $SO_x$ (X is an integer). In particular, the advantage of adding an oxidant in accordance with the present invention is that coloration of the cured film can be prevented and film thickness reduction caused by decomposition can be decreased. Examples of suitable antioxidants include hydrazides, hindered amine antioxidants, nitrogen-containing heterocyclic mercapto compounds, thioether antioxidants, hindered phenol antioxidants, ascorbic acids, zinc sulfate, thiocyanic acid salts, thiourea derivatives, saccharides, nitrites, sulfites, thiosulfates, and hydroxylamine derivatives. Among them, from the standpoint of preventing coloration of the cured film and film thickness reduction, hindered phenol antioxidants and thioether antioxidants are preferred.

Examples of suitable commercial antioxidants include Irganox 1010, 1035, 1076, and 1222 (all above are manufactured by Ciba-Geigy Co.), Antigene P, 3C, FR, Sumilizer S, Sumilizer GA80 (manufactured by Sumitomo Chemical Co., Ltd.), and Adekastab A070, A080, and A0503 (manufactured by ADEKA). These antioxidants may be used individually or in mixtures thereof.

(Polymerization Inhibitor)

It is preferred that the resist composition include a small amount of a polymerization inhibitor. The content ratio of the polymerization inhibitor is not less than 0.001 percent by mass and not greater than 1 percent by mass, preferably not less than 0.005 percent by mass and not greater than 0.5 percent by mass, and even more preferably not less than 0.008 percent by mass and not greater than 0.05 percent by mass, on the basis of the entire polymerizable monomer. Where the polymerization inhibitor is compounded in an adequate amount, variation of viscosity with time can be inhibited, while maintaining high curing sensitivity.

Various solvents can be included, as necessary, in the resist composition. The preferred solvent has a boiling point of 80 to 280° C. under the normal pressure. Any solvent capable of dissolving the composition can be used, but a solvent having at least one from among an ester structure, a ketone structure, a hydroxyl group, and an ether structure is preferred. Specific examples of preferred solvents include propylene glycol monomethyl ether acetate, cyclohexanone, 2-heptanone, gamma butyrolactone, propylene glycol monomethyl ether, lactic acid esters, and mixtures thereof. From the standpoint of coating uniformity, a solvent including propylene glycol monomethyl ether acetate is most preferred.

The content ratio of the solvent in the resist composition can be optimized according to the viscosity of components (without the solvent), coatability, and target film thickness, and from the standpoint of improving coatability, the content ratio of the solvent in the entire composition is from 0 percent by mass to percent by mass, more preferably from 0 percent by mass to 97 percent by mass. When a pattern with a film thickness of equal to or less than 500 nm is formed, the content ratio of the solvent is preferably not less than 20 percent by mass and not greater than 99 percent by mass, more preferably not less than 40 percent by mass and not greater than 99 percent by mass, and even more preferably not less than 70 percent by mass and not greater than 98 percent by mass.

(Polymer Component)

With the object of further increasing the crosslinking density, the resist composition can include, within a range in which the object of the present invention is attained, a polyfunctional oligomer with a molecular weight even higher than the above-described polyfunctional other polymerizable monomers. Examples of polyfunctional oligomers having photoradical polymerization ability include various acrylate oligomers such as polyester acrylates, urethane acrylates, polyether acrylates, and epoxy acrylates. The amount of the oligomer component added to the resist composition is preferably 0 percent by mass to 30 percent by mass, more preferably 0 percent by mass to 20 percent by mass, even more preferably 0 percent by mass to 10 percent by mass, and most preferably 0 percent by mass to 5 percent by mass, on the basis of the composition components (without the solvent).

From the standpoint of improving dry etching resistance, imprint suitability, and curability, it is preferred that the resist composition include a polymer component. A polymer having a polymerizable functional group in a side chain is preferred as such polymer component. From the standpoint of compatibility with the polymerizable monomer, it is preferred that the weight-average molecular weight of the polymer component be not less than 2,000 and not greater than 100,000, more preferably not less than 5,000 and not greater than 50,000.

The amount of the polymer component is preferably 0 percent by mass to 30 percent by mass, more preferably 0 percent by mass to 20 percent by mass, even more preferably 0 percent by mass to 10 percent by mass, and most preferably equal to or less than 2 percent by mass, with respect to the components, without the solvent, of the composition. From the standpoint of pattern formation ability, it is preferred that the content ratio of the polymer component with a molecular weight of equal to or higher than 2,000 in the resist component be equal to or less than 30 percent by mass, with respect to the components, without the solvent, of the composition. It is preferred that the amount of the resin component be as small as possible and that the resin component be not included at all, except for the surfactant and very small amounts of additives.

If necessary, a parting agent, a silane coupling agent, a UV absorber, a photostabilizer, an antiaging agent, a plasticizer, an adhesion enhancer, a thermopolymerization initiator, a colorant, elastomer particles, a photoacid-generating agent, a photobase-generating agent, a basic compound, a fluidity adjusting agent, an antifoaming agent, and a dispersant may be added, in addition to the above-described components, to the resist composition.

The resist composition can be prepared by mixing the above-described component. After the components have been mixed, the composition can be prepared as a solution, for example, by filtering with a filter having a pore diameter of 0.003 μm to 5.0 μm. Mixing and dissolution of curable compositions for photoimprinting is usually performed within a temperature range of 0° C. to 100° C. The filtration may be performed in multipole stages or in multiple cycles. The filtered liquid can be re-filtered. A polyethylene resin, a polypropylene resin, a fluororesin, and a Nylon resin can be used as the filter material used for filtration, but this list is not limiting.

It is preferred that the viscosity (at 25° C.) of components, without the solvent, in the resist composition be not less than 1 mPa·s and not greater than 100 mPa·s, more preferably not less than 3 mPa·s and not greater than 50 mPa·s, and even more preferably not less than 5 mPa·s and not greater than 30 mPa·s. Where the viscosity is set within the adequate range, brachymorphic ability of the pattern can be increased and a smaller film thickness can be obtained.

Nanoimprint systems, devices, and methods in accordance with the present invention are explained hereinabove in detail, but the present invention is not limited to the above-described examples and can be variously changed or modified without departing from the essence of the present invention.

<Notes>

As follows from the description of the embodiments explained hereinabove in detail, the present description includes the disclosure of a variety of technical ideas including the below-described aspects of the invention.

One aspect of the invention is directed to a liquid application device comprising: a liquid discharge head having a structure in which nozzles for performing droplet ejection of a functional liquid onto a substrate are aligned in a row in a predetermined direction, and including liquid chambers connected to the nozzles respectively and piezoelectric elements which are provided correspondingly to the liquid chambers and serve to pressurize the liquid in the liquid chambers; a relative movement unit for causing relative movement between the substrate and the liquid discharge head; and a droplet ejection control unit for operating the piezoelectric elements so as to cause the liquid to land discretely on the substrate, and controlling operation of the piezoelectric elements according to each of groups formed by grouping the nozzles correspondingly to the structure of the liquid discharge head.

According to this aspect of the invention, the nozzles and the piezoelectric elements corresponding to the nozzles are grouped and jetting control is performed for each group. Therefore, the occurrence of ejected droplet density variations caused by spread among the nozzles or piezoelectric elements can be inhibited.

The "functional liquid" in the present invention is a liquid including a component of a functional material that can form a fine pattern of the substrate. Examples of such functional liquids include photocurable liquid resins such as liquid resists and thermocurable liquid resins that can be cured by heating.

Examples of grouping for the plurality of nozzles according to the structure of the liquid discharge nozzle includes grouping of the nozzles according to the arrangement, shape and structure of liquid chambers communicating with the nozzles and arrangement, shape, and structure of liquid supply channels communicating with the liquid chambers.

Desirably, the liquid discharge head has a structure in which a nozzle row constituted by the nozzles is sandwiched between the liquid chambers in such a manner that the liquid chambers are disposed on both sides of the nozzle row; and the droplet ejection control unit controls the operation of the piezoelectric elements according to each of the groups including a first nozzle group connected to first liquid chambers disposed on one side of the nozzle row being defined as a first group, and a second nozzle group connected to second liquid chambers disposed on the other side of the nozzle row being defined as a second group.

In this aspect of the invention, by grouping the nozzles according to the arrangement structure of communicating liquid chambers in the liquid discharge head having a structure in which the plurality of liquid chambers sandwich a nozzle row constituted by the plurality of nozzles and are disposed on both sides of the nozzle row, it is possible to avoid a spread of discharge characteristics caused the flow channel structure such as flow channel resistance between the liquid flow channels and the nozzles and to optimize the arrangement density of the liquid.

Desirably, the liquid discharge head has a structure in which the nozzles included in the first nozzle group and the nozzles included in the second nozzle group are disposed alternately.

As a structural example of the liquid discharge head of such a configuration, liquid supply channels are provided at both sides of the nozzle row.

Desirably, the first liquid chambers and the second liquid chambers have a structure compartmentalized for each nozzle; and the piezoelectric elements has an integrated piezoelectric body for the first liquid chambers or the second liquid chambers and electrodes formed corresponding to compartments for the respective nozzles.

According to this aspect of the invention, the spread in jetting caused by individual differences between a piezoelectric element provided with the first liquid chamber and a piezoelectric element provided with the second liquid chamber can be avoided.

In a specific example of such a configuration, there are provided a comb-shaped common electrode and individual electrodes that are positioned in the comb-like shape of the common electrode and provided correspondingly to the positions of nozzles (segments).

Desirably, the liquid application device comprises: a head rotation unit for rotating the liquid discharge head within a plane parallel to a plane of the substrate onto which the functional liquid lands; and a droplet ejection density change unit for causing the head rotation unit to rotate the liquid discharge head so as to change a droplet ejection density in terms of a direction substantially perpendicular to a direction of the relative movement.

According to this aspect of the invention, the jetting (landing) positions in the arrangement direction of nozzles can be finely adjusted within a range less than the nozzle arrangement interval with respect to the arrangement direction of nozzles and the average application amount corresponding to the jetting pattern can be changed.

In such a configuration, the occurrence of discontinuity of ejected droplet density can be avoided by configuring the liquid discharge nozzle so that all the nozzles are rotated integrally.

Desirably, the droplet ejection control unit operates the piezoelectric elements so as to change a droplet ejection pitch in a direction substantially parallel to a direction of the relative movement within a range less than a minimum droplet ejection pitch.

According to this aspect of the invention, the average application amount in the movement direction of the relative movement unit can be changed according to the jetting pattern.

In such a configuration, it is desirable that a drive voltage generation unit be provided for generating a drive voltage to be applied to the piezoelectric elements, and the drive voltage generation unit be configured to be capable of changing the period of drive voltage.

When the ejected droplet density is changed by the ejected droplet density changing unit according to the above aspect, it is desirable that the ejected droplet density be changed according to this aspect of the invention.

Desirably, the droplet ejection control unit changes timing for operating the piezoelectric elements within a range less than a minimum droplet ejection period.

According to this aspect of the invention, the jetting position in the relative movement direction of the relative movement unit can be finely adjusted with respect to this direction within a range less than the predetermined minimum jetting (landing) interval.

As a specific example of such a configuration, a delay time generation unit may be provided for generating a delay time shorter than the minimum drop ejection period, and the delay time generated by the delay time generation unit is added to the predetermined drop ejection period.

Desirably, the droplet ejection control unit adds a delay time less than a minimum droplet ejection period so as to delay timing for operating the piezoelectric elements.

In this aspect of the invention, it is preferred that a delay time generation unit be provided for generating a delay time shorter than the minimum droplet ejection period.

Desirably, the droplet ejection control unit changes waveforms of drive voltage applied to the piezoelectric elements according to each of the groups.

According to this aspect of the invention, by changing the waveform of the drive voltage, it is possible to correct the spread in jetting droplet amount caused by individual spread (thickness, piezoelectric constant, Young's modulus) of the piezoelectric elements.

As a specific example of such a configuration, the waveform of the drive voltage is changed according to the discharge characteristic of each group.

Desirably, the droplet ejection control unit makes maximum values of drive voltage applied to the piezoelectric elements different according to each of the groups.

According to this aspect of the invention, the jetting droplet amount can be changed for each group according to the maximum value of drive voltage and uniformity of jetting droplet amount among the groups is improved.

Desirably, the droplet ejection control unit changes width of maximum amplitude sections of drive voltage applied to the piezoelectric elements according to each of the groups.

According to this aspect of the invention, the width (that is, pulse width) of the maximum amplitude section of drive voltage can be changed for each group and uniformity of jetting droplet amount among the groups is improved.

A portion corresponding to the state in which the pulling operation is maintained in the drive voltage causing pull-push drive of the piezoelectric elements is included in examples of the "maximum amplitude sections" in this configuration.

Desirably, the liquid application device comprises: a droplet ejection number measurement unit for measuring the number of droplet ejection events for each of the groups; and a droplet ejection number storage unit for storing the measured number of droplet ejection events for each of the groups.

According to this aspect of the invention, the number of droplet ejection events can be determined for each group and the feedback to jetting control is possible.

Desirably, the liquid application device comprises a selection unit for selecting a group of nozzles to perform the droplet ejection according to a storage result of the droplet ejection number storage unit, wherein the droplet ejection control unit controls operation of the piezoelectric elements according to a selection result of the selection unit.

According to this aspect of the invention, uniformity of usage frequency (jetting frequency) for each group can be improved and contribution can be made to the improvement of endurance of the liquid discharge head.

Desirably, the liquid discharge head has a structure in which the nozzles have a substantially square planar shape and are arranged in such a manner that a side of the square planar shape extend in a direction substantially parallel to an arrangement direction of the nozzles; and the liquid application device comprises an observation unit for observing the ejected droplets in terms of a direction at an angle of about 45° with respect to a direction of a diagonal of each nozzle.

According to this aspect of the invention, the group selection can be carried out according to the observation results of the observation unit.

In this aspect of the invention, desirably, a determination unit can be provided for determining the presence of nozzle abnormality according to each group by using the observation results of the observation unit.

Another aspect of the invention is directed to a liquid application method comprising the steps of causing relative movement between a substrate and a liquid discharge head having a structure in which nozzles for performing droplet ejection of a functional liquid onto the substrate are aligned in a row in a predetermined direction and including liquid chambers connected to the nozzles respectively and piezoelectric elements which are provided correspondingly to the liquid chambers and serve to pressurize the liquid in the liquid chambers, and causing the piezoelectric elements to operate with a predetermined droplet ejection period in such a manner that the liquid lands discretely on the substrate, wherein the piezoelectric elements are operated so as to cause the liquid to land discretely on the substrate, the plurality of nozzles are grouped correspondingly to the structure of the liquid discharge head, and operation of the piezoelectric elements is controlled according to each of the groups.

According to this aspect of the invention, it is desirable that an ejected droplet density variation step of changing the ejected droplet density be provided. Further, the configuration including a jetting event number measurement step of measuring the number of droplet ejection events for each group and a storing step of storing the measured number of droplet ejection events is preferred.

Another aspect of the invention is directed to a nanoimprint system comprising: a liquid discharge head having a structure in which nozzles for performing droplet ejection of a functional liquid onto a substrate are aligned in a row in a predetermined direction, and including liquid chambers connected to the nozzles respectively and piezoelectric elements which are provided correspondingly to the liquid chambers and serve to pressurize the liquid in the liquid chambers; a relative movement unit for causing relative movement between the substrate and the liquid discharge head; a droplet ejection control unit for operating the piezoelectric elements so as to cause the liquid to land discretely on the substrate, and controlling operation of the piezoelectric elements according to each of groups formed by grouping the nozzles correspondingly to the structure of the liquid discharge head; and a transfer unit for transferring a protrusion-depression pattern formed on a mold.

This aspect of the invention can be especially preferably used for nanoimprint lithography in which submicron fine patterns are formed. An imprint device may be provided so as to use each feature (each aspect) of the present invention.

Desirably, the transfer unit includes: a pressing unit for pressing a surface of the mold on which the protrusion-depression pattern is formed, against a surface of the substrate onto which the liquid is applied; a curing unit for curing the liquid between the mold and the substrate; and a separation unit for separating the mold from the substrate.

Desirably, the nanoimprint system comprises a separation unit for separating the mold from the substrate after transferring the protrusion-depression pattern by the transfer unit; a pattern formation unit for forming on the substrate a pattern corresponding to the protrusion-depression pattern of the mold by using, as a mask, a film formed by the liquid onto which the protrusion-depression pattern has been transferred and which has been cured; and a removal unit for removing the film.

With such a configuration, the preferred submicron fine pattern can be formed.

REFERENCE SIGNS LIST 10, 102 Substrate
12, 110 Inkjet head
14 Droplet
16, 122 Mold
18 Photocurable resin film
20, 22, 24, 28 Protrusion
26 Depression
100 Nanoimprint system
104 Resist application unit
106 Pattern transfer unit
108 Conveying unit
114 UV irradiation device
120, 120A, 120B Nozzle
121, 121', 121" Piezoelectric element
122, 122A, 122B Liquid chamber
172 System controller
180 Droplet ejection control unit
184 Head driver
192 Sensor
194 Counter
404 Waveform generating unit
405 Delay data generating unit

CITATION LIST

Patent Literatures

PTL 1: International Publication No. WO 2005/120834
PTL 2: Japanese Patent Application Publication No. 2009-088376
PTL 3: Japanese Patent Application Publication No. 2009-218550
PTL 4: Japanese Patent Application Publication No. 11-100378
PTL 5: Japanese Patent Application Publication No. 04-036263
PTL 6: Japanese Patent Application Publication No. 04-069360
PTL 7: Japanese Patent Application Publication No. 2008-105414

What is claimed is:

1. A liquid application device comprising:
a liquid discharge head having a structure in which nozzles configured to perform droplet ejection of a functional liquid onto a substrate are aligned in a row in a predetermined direction, and including liquid chambers connected to the nozzles respectively and piezoelectric elements which are provided correspondingly to the liquid chambers and are configured to pressurize the liquid in the liquid chambers;
a relative movement unit configured to cause relative movement between the substrate and the liquid discharge head; and
a droplet ejection control unit which is configured to operate the piezoelectric elements so as to cause the liquid to land discretely on the substrate, and is configured to control operation of the piezoelectric elements according to each of groups formed by grouping the nozzles correspondingly to the structure of the liquid discharge head, wherein:
in the liquid discharge head, a nozzle row constituted by the nozzles is sandwiched between the liquid chambers in such a manner that the liquid chambers are disposed on both sides of the nozzle row;
the droplet ejection control unit is configured to control the operation of the piezoelectric elements according to each of the groups including a first nozzle group connected to first liquid chambers disposed on one side of the nozzle row being defined as a first group, and a second nozzle group connected to second liquid chambers disposed on the other side of the nozzle row being defined as a second group;
the first liquid chambers and the second liquid chambers are compartmentalized for each nozzle; and
the piezoelectric elements have an integrated piezoelectric body for the first liquid chambers or the second liquid chambers and electrodes formed corresponding to compartments for the respective nozzles.

2. The liquid application device according to claim 1, wherein in the liquid discharge head, the nozzles included in the first nozzle group and the nozzles included in the second nozzle group are disposed alternately.

3. The liquid application device according to claim 1, further comprising:
a head rotation unit configured to rotate the liquid discharge head within a plane parallel to a plane of the substrate onto which the functional liquid lands; and a droplet ejection density change unit configured to cause the head rotation unit to rotate the liquid discharge head so as to change a droplet ejection density in terms of a direction substantially perpendicular to a direction of the relative movement.

4. The liquid application device according to claim 1, wherein the droplet ejection control unit is configured to operate the piezoelectric elements so as to change a droplet ejection pitch in a direction substantially parallel to a direction of the relative movement within a range less than a minimum droplet ejection pitch.

5. The liquid application device according to claim 1, wherein the droplet ejection control unit is configured to change timing for operating the piezoelectric elements within a range less than a minimum droplet ejection period.

6. The liquid application device according to claim 1, wherein the droplet ejection control unit is configured to add a delay time less than a minimum droplet ejection period so as to delay timing for operating the piezoelectric elements.

7. The liquid application device according to claim 1, wherein the droplet ejection control unit is configured to change waveforms of drive voltage applied to the piezoelectric elements according to each of the groups.

8. The liquid application device according to claim 1, wherein the droplet ejection control unit is configured to make maximum values of drive voltage applied to the piezoelectric elements different according to each of the groups.

9. The liquid application device according to claim 1, wherein the droplet ejection control unit is configured to change width of maximum amplitude sections of drive voltage applied to the piezoelectric elements according to each of the groups.

10. The liquid application device according to claim 1, further comprising:
  a droplet ejection number measurement unit configured to measure the number of droplet ejection events for each of the groups; and
  a droplet ejection number storage unit configured to store the measured number of droplet ejection events for each of the groups.

11. The liquid application device according to claim 10, further comprising a selection unit configured to select a group of nozzles to perform the droplet ejection according to a storage result of the droplet ejection number storage unit,
  wherein the droplet ejection control unit is configured to control operation of the piezoelectric elements according to a selection result of the selection unit.

12. The liquid application device according to claim 1, wherein:
  in the liquid discharge head, the nozzles have a substantially square planar shape and are arranged in such a manner that a side of the square planar shape extend in a direction substantially parallel to an arrangement direction of the nozzles; and
  the liquid application device further comprises an observation unit configured to observe the ejected droplets in terms of a direction at an angle of about 45° with respect to a direction of a diagonal of each nozzle.

13. A liquid application method comprising the steps of causing relative movement between a substrate and a liquid discharge head having a structure in which nozzles configured to perform droplet ejection of a functional liquid onto a substrate are aligned in a row in a predetermined direction and including liquid chambers connected to the nozzles respectively and piezoelectric elements which are provided correspondingly to the liquid chambers and are configured to pressurize the liquid in the liquid chambers, and causing the piezoelectric elements to operate with a predetermined droplet ejection period in such a manner that the liquid lands discretely on the substrate, wherein:
  the piezoelectric elements are operated so as to cause the liquid to land discretely on the substrate, the plurality of nozzles are grouped correspondingly to the structure of the liquid discharge head, and operation of the piezoelectric elements is controlled according to each of the groups;
  in the liquid discharge head, a nozzle row constituted by the nozzles is sandwiched between the liquid chambers in such a manner that the liquid chambers are disposed on both sides of the nozzle row;
  the droplet ejection control unit is configured to control the operation of the piezoelectric elements according to each of the groups including a first nozzle group connected to first liquid chambers disposed on one side of the nozzle row being defined as a first group, and a second nozzle group connected to second liquid chambers disposed on the other side of the nozzle row being defined as a second group;
  the first liquid chambers and the second liquid chambers are compartmentalized for each nozzle; and
  the piezoelectric elements have an integrated piezoelectric body for the first liquid chambers or the second liquid chambers and electrodes formed corresponding to compartments for the respective nozzles.

14. A nanoimprint system comprising:
  a liquid discharge head having a structure in which nozzles configured to perform droplet ejection of a functional liquid onto a substrate are aligned in a row in a predetermined direction, and including liquid chambers connected to the nozzles respectively and piezoelectric elements which are provided correspondingly to the liquid chambers and are configured to pressurize the liquid in the liquid chambers;
  a relative movement unit configured to cause relative movement between the substrate and the liquid discharge head;
  a droplet ejection control unit which is configured to operate the piezoelectric elements so as to cause the liquid to land discretely on the substrate, and is configured to control operation of the piezoelectric elements according to each of groups formed by grouping the nozzles correspondingly to the structure of the liquid discharge head; and
  a transfer unit configured to transfer a protrusion-depression pattern formed on a mold, wherein:
  in the liquid discharge head, a nozzle row constituted by the nozzles is sandwiched between the liquid chambers in such a manner that the liquid chambers are disposed on both sides of the nozzle row;
  the droplet ejection control unit is configured to control the operation of the piezoelectric elements according to each of the groups including a first nozzle group connected to first liquid chambers disposed on one side of the nozzle row being defined as a first group, and a second nozzle group connected to second liquid chambers disposed on the other side of the nozzle row being defined as a second group;
  the first liquid chambers and the second liquid chambers are compartmentalized for each nozzle; and
  the piezoelectric elements have an integrated piezoelectric body for the first liquid chambers or the second liquid chambers and electrodes formed corresponding to compartments for the respective nozzles.

15. The nanoimprint system according to claim 14, wherein the transfer unit includes:
- a pressing unit configured to press a surface of the mold on which the protrusion-depression pattern is formed, against a surface of the substrate onto which the liquid is applied;
- a curing unit configured to cure the liquid between the mold and the substrate; and
- a separation unit configured to separate the mold from the substrate.

16. The nanoimprint system according to claim 14, further comprising:
- a separation unit configured to separate the mold from the substrate after transferring the protrusion-depression pattern by the transfer unit;
- a pattern formation unit configured to form on the substrate a pattern corresponding to the protrusion-depression pattern of the mold by using, as a mask, a film formed by the liquid onto which the protrusion-depression pattern has been transferred and which has been cured; and
- a removal unit configured to remove the film.

* * * * *

UNITED STATES PATENT AND TRADEMARK OFFICE
CERTIFICATE OF CORRECTION

PATENT NO. : 8,894,187 B2
APPLICATION NO. : 13/730578
DATED : November 25, 2014
INVENTOR(S) : Kenichi Kodama et al.

It is certified that error appears in the above-identified patent and that said Letters Patent is hereby corrected as shown below:

Title page, item 63 should read
Continuation of application No. PCT/JP2011/065242 filed on June 28, 2011

Signed and Sealed this
Twenty-sixth Day of May, 2015

Michelle K. Lee
*Director of the United States Patent and Trademark Office*